(12) United States Patent
Lee

(10) Patent No.: US 9,865,342 B2
(45) Date of Patent: Jan. 9, 2018

(54) SEMICONDUCTOR MEMORY DEVICES HAVING SEPARATE SENSING CIRCUITS AND RELATED SENSING METHODS

(71) Applicant: Jaekyu Lee, Seongnam-si (KR)

(72) Inventor: Jaekyu Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/956,478

(22) Filed: Dec. 2, 2015

(65) Prior Publication Data

US 2016/0172026 A1 Jun. 16, 2016

(30) Foreign Application Priority Data

Dec. 12, 2014 (KR) .................. 10-2014-0179296

(51) Int. Cl.
*G11C 13/00* (2006.01)
*G11C 11/16* (2006.01)

(52) U.S. Cl.
CPC ........ *G11C 13/004* (2013.01); *G11C 11/1655* (2013.01); *G11C 11/1673* (2013.01); *G11C 13/0026* (2013.01); *G11C 2013/0045* (2013.01); *G11C 2013/0054* (2013.01); *G11C 2213/79* (2013.01)

(58) Field of Classification Search
CPC .................................................. G11C 13/004
USPC ....................................................... 365/148
See application file for complete search history.

(56) References Cited

U.S. PATENT DOCUMENTS

| | | | |
|---|---|---|---|
| 6,337,824 B1* | 1/2002 | Kono | G11C 11/406 257/E27.097 |
| 6,567,297 B2 | 5/2003 | Baker | |
| 7,539,068 B2 | 5/2009 | Wang et al. | |
| 8,027,206 B2* | 9/2011 | Yoon | G11C 11/16 365/158 |
| 8,154,903 B2 | 4/2012 | Jung et al. | |
| 8,509,002 B2 | 8/2013 | Choi et al. | |
| 8,654,595 B2 | 2/2014 | Kim et al. | |
| 8,665,655 B2 | 3/2014 | Lee et al. | |
| 2008/0232177 A1* | 9/2008 | Choi | G11C 13/00 365/189.15 |
| 2011/0176350 A1 | 7/2011 | Jung et al. | |
| 2012/0262993 A1 | 10/2012 | Moschiano et al. | |
| 2013/0002352 A1 | 1/2013 | Jung et al. | |
| 2014/0185361 A1 | 7/2014 | Oh et al. | |
| 2014/0185401 A1 | 7/2014 | Yang et al. | |

FOREIGN PATENT DOCUMENTS

KR 1020100123331 A 11/2010
KR 1020120063395 A 6/2012

* cited by examiner

*Primary Examiner* — Hoai V Ho
*Assistant Examiner* — Muna A Techane
(74) *Attorney, Agent, or Firm* — Myers Bigel, P.A.

(57) ABSTRACT

A sensing circuit of a semiconductor memory device is provided which includes a bit line having a first edge and a second edge, a sensing line, a current supply unit, and a sense amplifier. A plurality of memory cells is connected between the first edge and the second edge. The sensing line is connected to the second edge of the bit line, and the current supply unit supplies a sensing current via the first edge of the bit line. The sense amplifier senses data stored at a selected memory cell by comparing a sensing voltage of the sensing line with a reference voltage when the sensing current flows to the selected memory cell from the first edge of the bit line.

16 Claims, 17 Drawing Sheets

$$R_{subject} = \frac{\text{Voltmeter indication}}{\text{Ammeter indication}}$$

SEMICONDUCTOR MEMORY DEVICES HAVING SEPARATE SENSING CIRCUITS AND RELATED SENSING METHODS

CROSS-REFERENCE TO RELATED APPLICATION

The present application claims priority under 35 U.S.C. §119 to Korean Patent Application No. 10-2014-0179296, filed on Dec. 12, 2014 in the Korean Intellectual Property Office, the entire contents of which are hereby incorporated by reference herein.

BACKGROUND

Embodiments of the inventive concepts described herein relate to semiconductor memory devices, and more particularly, to resistive memory devices that have a separate sensing circuits and to related methods of sensing data.

Semiconductor memory devices are classified into volatile memory devices and nonvolatile memory devices.

Volatile memory devices, such as SRAM, DRAM, SDRAM, etc., lose data stored therein at power-off, while nonvolatile memory devices retain data stored therein even at power-off. Example nonvolatile memory devices include a Read Only Memory (ROM), a Programmable ROM (PROM), an Electrically Programmable ROM (EPROM), an Electrically Erasable and Programmable ROM (EEPROM), a flash memory device, a Phase-change RAM (PRAM), a Magnetic RAM (MRAM), a Resistive RAM (ReRAM), a Ferroelectric RAM (FRAM), etc.

Various of the nonvolatile memory devices, including the MRAM, PRAM, and ReREM memory devices, may store data based on a resistance state of each memory cell. For this reason, such nonvolatile memory devices may be called "resistance memory" devices. A sensing margin of a sensing circuit may take on increased importance when a ratio of high resistance to low resistance is reduced.

SUMMARY

Embodiments of the inventive concepts provide a semiconductor memory device and a data sensing method capable of maintaining a sensing margin of a sense amplifier constantly regardless of whether or not a selected memory cell belongs to a near cell area or a far cell area.

Embodiments of the inventive concepts provide a semiconductor memory device and a data sensing method capable of increasing the number of memory cells that are connected to a bit line.

One aspect of embodiments of the inventive concepts is directed to providing a sensing circuit of a semiconductor memory device which includes a bit line having a first end and a second end, a sensing line, a current supply unit, and a sense amplifier. A plurality of memory cells are connected between the first end and the second end of the bit line. The sensing line is connected to the second end of the bit line, and the current supply unit supplies a sensing current to the first end of the bit line. The sense amplifier may sense data stored at a selected memory cell by comparing a sensing voltage of the sensing line with a reference voltage when the sensing current flows to the selected memory cell from the first end of the bit line.

When a first memory cell of the plurality of memory cells is connected to the first end of the bit line, a last memory cell of the plurality of memory cells may be connected to the second end of the bit line.

When a first memory cell of the plurality of memory cells is connected to the second end of the bit line, a last memory cell of the plurality of memory cells may be connected to the first end of the bit line.

The sensing current may flow from the first end of the bit line to a voltage measurement node that is connected to the selected memory cell and may not flow between the voltage measurement node and the second end of the bit line.

The sensing current may not flow through the sensing line.

The current supply unit may include a PMOS transistor that is configured to supply and adjust the sensing current in response to a bias voltage.

The sense amplifier may be a voltage sense amplifier having a cross-coupled differential amplifier type or a current-mirror differential amplifier type.

The first end of the bit line may be connected to the current supply unit via a first column selection transistor.

The sensing line may include a first local input/output line that is connected to a first column selection transistor, a second local input/output line that is connected to a second column selection transistor, and a jumping metal line that is connected to the second local input/output line.

Each memory cell may be a resistive, nonvolatile memory cell.

Another aspect of embodiments of the inventive concepts is directed to a semiconductor memory device which includes a bit line, a sensing line, and a sensing circuit. The bit line may have a first end and a second end, and a plurality of memory cells may be connected between the first end and the second end of the bit line. The sensing line may be connected to the second end of the bit line. The sensing circuit may supply a sensing current to the bit line via the first end of the bit line and may sense data stored at a selected one of the memory cells using a sensing line voltage of the sensing line.

The sensing circuit may include a first MOS transistor that is configured to generate a sensing current in response to a bias voltage; a second MOS transistor that is configured to adjust the sensing current in response to a clamping control voltage to clamp a voltage of a bit line node that is connected to the selected memory cell to be substantially equal to a predetermined clamping voltage; a comparator that is configured to compare the clamping voltage and the sensing line voltage and to generate the clamping control voltage based on a result of the comparison; and a sense amplifier that is configured to compare a sensing voltage of a sensing voltage node, to which the first and second MOS transistors are connected in common, with a reference voltage and output a result of the comparison as sensing data.

Still another aspect of embodiments of the inventive concepts is directed to a semiconductor memory device which includes a source line, a feedback line, and a source line driving circuit. The source line may be connected in common to sources of a plurality of memory cells that are provided between a first end and a second end of the source line. The feedback line may be connected to the second end of the source line. The source line driving circuit may adjust a driving current flowing to the source line based on a difference between a feedback voltage of the feedback line and a predetermined source line reference voltage.

The source line driving circuit may include a source line current supply unit that is configured to supply the driving current to the source line via the first end of the source line in response to a driving control signal; and a source line driving control unit that is configured to compare the feedback voltage and the predetermined source line reference voltage to generate the driving control signal.

The semiconductor memory device may further include a bit line that is in parallel to the source line, the bit line having a third end and a fourth end, a plurality of memory cells being connected between the third end and the fourth end; a sensing line connected to the fourth end of the bit line; and a sensing circuit configured to supply a sensing current to the bit line via the third end of the bit line and to sense data stored at a selected one of the memory cells using a sensing line voltage of the sensing line.

The sensing circuit may include a PMOS transistor that is configured to generate a sensing current in response to a bias voltage; an NMOS transistor that is configured to adjust the sensing current in response to a clamping control voltage to clamp a voltage of a bit line node that is connected to the selected memory cell to be substantially equal to a predetermined clamping voltage; a comparator that is configured to compare the clamping voltage and the sensing line voltage and generate the clamping control voltage based on a result of the comparison; and a sense amplifier that is configured to compare a sensing voltage of a sensing voltage node, to which the PMOS and NMOS transistors are connected in common, with a reference voltage and output a result of the comparison as sensing data of the selected memory cell.

A data sensing method is provided which includes supplying a controlled sensing current to a first end of a bit line that is connected to a plurality of memory cells; receiving a sensing voltage, based on a resistance state of a selected one of the memory cells, from a sensing line that is connected to a second end of the bit line; and comparing the sensing voltage with a predetermined reference voltage to sense data stored at the selected memory cell.

The sensing voltage may be received under a condition where no current flows to the sensing line.

The memory cell may include a Magnetic Tunnel Junction (MTJ) element and a cell transistor.

According to exemplary embodiments of the inventive concepts, a sensing margin of a sense amplifier is constantly maintained regardless of whether or not a selected memory cell belongs to a near cell area or a far cell area, thereby increasing the number of memory cells that may be connected to a bit line.

DETAILED DESCRIPTION

Figure 1:
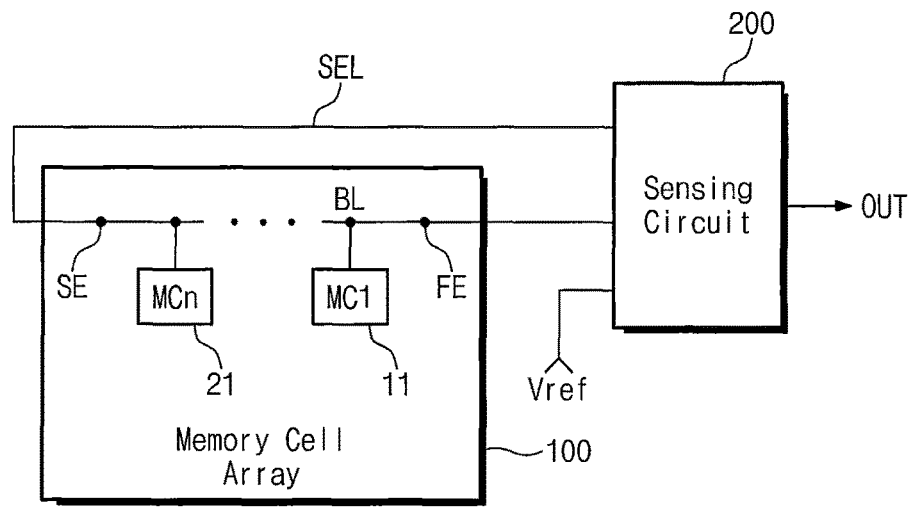
FIG. 1 is a block diagram schematically illustrating a portion of a semiconductor memory device according to an exemplary embodiment of the inventive concepts.

Embodiments of the inventive concepts are described in detail below with reference to the accompanying drawings. The inventive concepts, however, may be embodied in various different forms, and should not be construed as being limited to the illustrated embodiments. Rather, these embodiments are provided as examples so that this disclosure will be thorough and complete, and will fully convey the inventive concepts to those skilled in the art. Accordingly, known processes, elements, and techniques may not be described with respect to some embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concepts.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or intervening elements or layers may be present. In contrast, when an element is referred to as being "directly on," "directly connected to", "directly coupled to", or "immediately adjacent" another element or layer, there are no intervening elements or layers present.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Fundamental operations such as a read operation, a write operation, etc. of a resistive memory (e.g., MRAM) and a detail description of internal circuits that perform such fundamental operations may not be described herein as these functions and basic circuits are well known to those skilled in the art.

FIG. 1 is a block diagram schematically illustrating a portion of a semiconductor memory device according to an exemplary embodiment of the inventive concepts.

Referring to FIG. 1, the semiconductor memory device contains a memory cell array 100 and a sensing circuit 200.

The memory cell array 100 includes a plurality of memory cells 11 and 21 that are connected to a bit line BL. In FIG. 1, a single bit line BL and two memory cells are illustrated to simplify the drawing, but the scope and spirit of the inventive concepts are not limited thereto. It thus will be appreciated that typically the memory cell array 100 will contain a plurality of bit lines, and each bit line may have n memory cells (n being a natural number of 2 or more) connected thereto.

In FIG. 1, the memory cells 11 and 21 are connected between a first end FE and a second end SE of the bit line BL. Here, the first end FE of the bit line BL is closer to the sensing circuit 200 than is the second end SE. However, the scope and spirit of the inventive concepts are not limited thereto. The "end" of a bit line may mean a portion of the bit line itself or including a portion electrically connected at a partial point of the bit line.

Since the first memory cell 11 that is near the first end FE of the bit line BL is closer to the sensing circuit 200 than is the n-th memory cell 21 that is near the second end SE, it is considered to be part of a "near cell area." Since the n-th memory cell 21 is far from the sensing circuit 200, it is considered to be part of "far cell area."

A sensing line SEL is provided that may ensure that the sensing circuit 200 operates with a constant sensing margin, regardless of whether or not a selected memory cell is located in the near cell area or the far cell area. The sensing line SEL is connected to the second end SE of the bit line BL.

The sensing circuit 200 is connected to the sensing line SEL and the bit line BL, and also receives a predetermined reference voltage Vref. The sensing circuit 200 supplies a sensing current to the bit line BL via the first end FE of the bit line BL.

The sensing circuit 200 senses data stored at a selected one of the plurality of memory cells that are connected to the bit line BL using a sensing line voltage that is provided to the sensing circuit 200 via the sensing line SEL.

As will be explained in greater detail below, a sensing margin of the n-th memory cell 21 in the far cell area and a sensing margin of the first memory cell 11 in the near cell area may be equal to each other because a supply line of a sensing current and a receiving line of a sensing voltage are separated.

Since sensing margin loss between the near cell area and the far cell area may be reduced or eliminated, the number of memory cells that are connected to the bit line BL may be increased by making the bit line BL longer.

Figure 2:
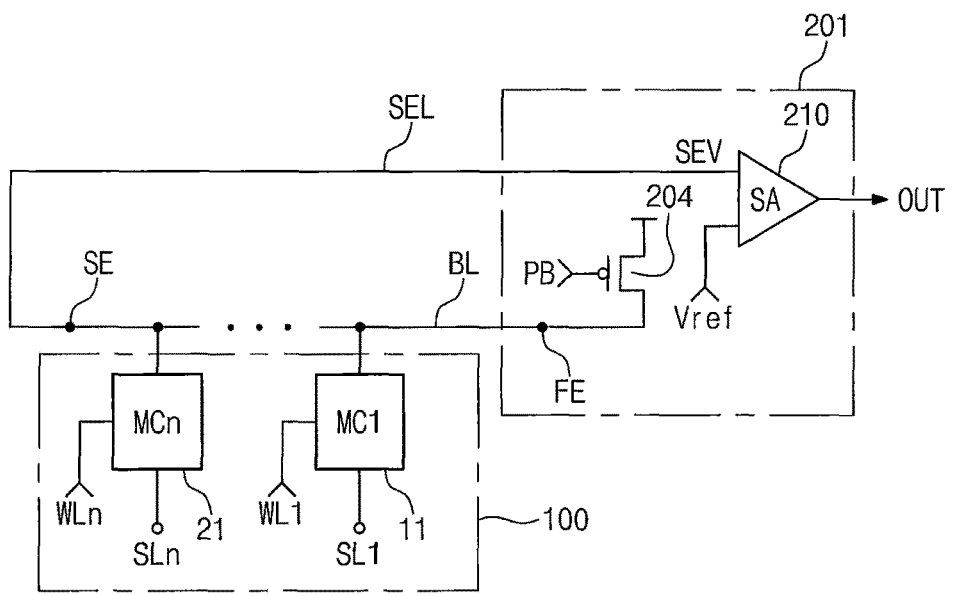
FIG. 2 is a diagram schematically illustrating an example implementation of the semiconductor memory device of FIG. 1.

FIG. 2 is a diagram that schematically illustrates an example implementation of the memory cell array and sensing circuit of FIG. 1.

Referring to FIG. 2, a sensing circuit 201 of a semiconductor memory device contains a bit line BL, a sensing line SEL, a current supply unit 204, and a sense amplifier 210.

A plurality of memory cells MC1 ... MCn are connected between a first end FE and a second end SE of the bit line BL.

The sensing line SEL is connected to the second end SE of the bit line BL.

The current supply unit 204 supplies a sensing current to the bit line BL via the first end FE of the bit line BL.

When the sensing current flows from the first end FE of the bit line BL to a selected one of the memory cells, the sense amplifier 210 compares a sensing voltage SEV that is provided over the sensing line SEL with a reference voltage Vref to sense data stored at the selected memory cell.

In the event that the first memory cell 11 is selected at a read operation, a sensing current flows from the first end FE of the bit line BL to a source line SL1 of the selected memory cell 11. A high impedance may prevent the sensing current from flowing to the second end SE of the bit line BL. Since no current flows over the remainder of the bit line BL, a voltage drop does not occur due to the resistance of the bit line BL, thereby making it possible to maintain the sensing margin regardless of which memory cell along the bit line BL is selected. The sensing voltage SEV appears on the sensing line SEL based on whether a selected memory cell has a high-resistance state or a low-resistance state, regardless of whether the selected memory cell belongs to a near cell area or a far cell area.

As the conductive line that provides the sensing voltage to the sense amplifier 210 (i.e., the sensing line SEL) is separate from the conductive line that provides the sensing current to the selected memory cell, sensing margin loss between the near cell area and the far cell area may be reduced or eliminated, thereby making it possible to increase the number of memory cells connected to the bit line BL.

For a resistive memory, ideal determination (data "0" or "1") of data may involve measuring a resistance value of a memory cell and a resistance value of a selection transistor using a sensing circuit that is located near the memory cell array. However, if the resistance value of the memory cell and the resistance value of the selection transistor are measured together with a peripheral parasitic resistance value, in particular, a line resistance value, a contact resistance value, and a resistance value of a bit line selection transistor, it may be more difficult to exactly determine the resistance of the memory cell in order to determine the data value stored in the memory cell. In particular, as the degree of integration of a memory cell array increases, parasitic resistance may increase due to a decrease in the line width of the memory cell array. As the amount of parasitic resistance increases, it can lead to errors in sensing data that is stored in the memory cells. That is, the following sensing errors may occur: data "1" may be determined as being "0" and data "0" may be determined as being "1". One of errors that may occur due to an increase in line resistance may be based on a near/far cell. That is, a sensing resistance difference may occur due to a line resistance difference between a memory cell that is located closer to a sensing circuit as compared to a memory cell that is farther from the sensing circuit. The sensing resistance difference may reduce a sensing margin of the sensing circuit.

Since sensing methods according to exemplary embodiments of the inventive concepts make it possible to measure resistance of a memory cell exactly and exclusively regardless of an increase or decrease in line resistance, a near/far cell condition may not cause problems during sensing operations.

Figure 3:
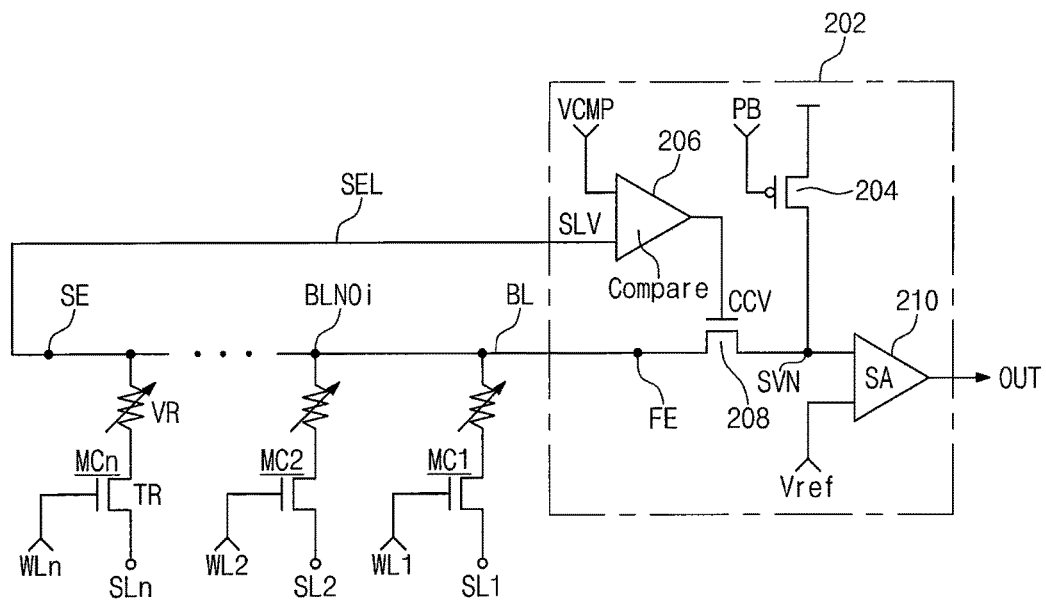
FIG. 3 is a diagram schematically illustrating another example implementation of the semiconductor memory device of FIG. 1.

FIG. 3 is a diagram that schematically illustrates another implementation of the memory cell array and sensing circuit of FIG. 1.

Referring to FIG. 3, a sensing circuit 202 is connected to a bit line BL and a sensing line SEL. A plurality of memory cells MC1, MC2, . . . MCn are connected to the bit line BL.

The sensing circuit 202 supplies a sensing current to the bit line BL via a first end FE of the bit line BL.

The sensing circuit 202 senses data stored at a selected one of the memory cells MC1, MC2, . . . MCn using a sensing line voltage SLV on the sensing line SEL.

The sensing circuit 202 contains a first MOS transistor 204 and a second MOS transistor 208. The first MOS transistor 204 generates a sensing current in response to a bias voltage PB. The second MOS transistor 208 adjusts the sensing current in response to a clamping control voltage CCV such that a voltage of a bit line node BLNOi that is connected to a selected memory cell is equal to a predetermined clamping voltage VCMP. Together, the first MOS transistor 204 and the second MOS transistor 208 form a sensing current supply unit.

The sensing circuit 202 further includes a comparator 206 and a sense amplifier 210. The comparator 206 compares the clamping voltage VCMP to the sensing line voltage SLV and generates the clamping control voltage CCV based on a result of this comparison. The comparator 206 may be implemented as an operational amplifier in some embodiments. The sense amplifier 210 compares a sensing voltage on a sensing voltage node SVN that is connected in common with the first and second MOS transistors 204 and 208 with a reference voltage Vref and outputs a result of this comparison as sensing data OUT.

The first MOS transistor 204 and the second MOS transistor 208 are implemented as a PMOS transistor and an NMOS transistor, respectively.

In FIG. 3, the memory cells MC1, MC2, . . . MCn may each be an MRAM cell, a PRAM cell, or a ReRAM cell. Each memory cell may contain a resistance-variable element VR and an access transistor TR.

An embodiment of the inventive concepts will be described under the following assumption: a current of about 1 µA flows to program a memory cell to have a high-resistance state via a write circuit, and a current of about 5 µA flows to program a memory cell to have a low-resistance state via the write circuit. As an example, a second word line WL2 is enabled to select a second memory cell MC2 during a read operation.

The first MOS transistor 204 with a current biasing function supplies an intermediate current (e.g., 3 µA) that is between 1 µA and 5 µA to the sensing voltage node SVN in response to a bias voltage PB. At this time, it is assumed that an initial voltage of the sensing voltage node SVN is about 3 V.

The second MOS transistor 208 with a clamping function adjusts the sensing current in response to a clamping control voltage CCV such that a voltage of a bit line node BLNOi that is connected to the selected memory cell MC2 is equal to a predetermined clamping voltage VCMP. A voltage of a first end FE of the bit line BL becomes equal to the clamping voltage VCMP when a memory cell MC1 is selected, and a voltage of a second end SE of the bit line BL becomes equal to the clamping voltage VCMP when a memory cell MCn is selected.

The comparator 206 compares the clamping voltage VCMP and a sensing line voltage SLV on the sensing line SEL and generates the clamping control voltage CCV based on a result of this comparison. For example, if the clamping voltage VCMP is set to 2 V, a voltage of the bit line node BLNOi is set to 2 V. Accordingly, the first end FE may have a voltage (e.g., 2.5 V) that is higher than a voltage of the bit line node BLNOi.

Here, a sensing current clamped by the second MOS transistor 208 flows from the first end FE of the bit line BL to a source line SL2 of the second memory cell MC2, but this current does not flow from the bit line node BLNOi to the second end SE due to the high impedance of the bit line BL.

Accordingly, since the clamped sensing current does not flow between the bit line node BLNOi and the sensing line SEL, a resistance value of the conductive lines connecting the bit line node BLNOi to the comparator 206 will not affect the sensing line voltage SLV. That is, since a voltage is not dropped between the bit line node BLNOi and the sensing line SEL, the sensing line voltage SLV may appear on the bit line node BLNOi with little or no variation.

As the comparator 206 and the second MOS transistor 208 operate, a voltage of the bit line node BLNOi that is connected to the selected memory cell MC2 is adjusted to be equal to the clamping voltage VCMP.

Accordingly, a voltage on the sensing voltage node SVN that is input to the sense amplifier 210 may be based solely on a resistance state of a selected memory cell MC2 regardless of whether the selected memory cell MC2 belongs to a near cell area or a far cell area. That is, since a current of 3 µA flows at a low-resistance state, a voltage of about 1 V dropped by 2 V from 3 V (initial voltage) may appear at the sensing voltage node SVN. In this case, the sense amplifier 210 compares a voltage of 1 V with a reference voltage Vref (e.g., 2.5 V) and outputs a result of this comparison as sensing data OUT having a logical low level. Meanwhile, since a current of 1 μA flows at a high-resistance state, a voltage of about 5 V increased by 2 V from 3 V (initial voltage) may appear at the sensing voltage node SVN. In this case, the sense amplifier 210 compares a voltage of 5 V with the reference voltage Vref and outputs a result of this comparison as sensing data OUT having a logical high level.

The above-described specific voltage examples are exemplary, and the scope and spirit of the inventive concepts are not limited thereto. It will also be appreciated that the above-description skips a pre-charge operation that is performed prior to the read operation.

Sensing margin loss between a near cell and a far cell does not occur if the sense amplifier performs voltage sensing under a condition where a voltage of a bit line node that is connected to a selected memory cell is set to be equal to a clamping voltage VCMP regardless of whether the selected memory cell is in a near cell area or a far cell area. Unlike a conventional sensing scheme where sensing margin loss becomes relatively greater when a selected memory cell is at an increased distance from the sense amplifier, the sensing margin between a near cell and a far cell is constant, thereby making it possible to increase the number of memory cells that are connected to a bit line, thereby increasing a memory capacity.

Figure 4:
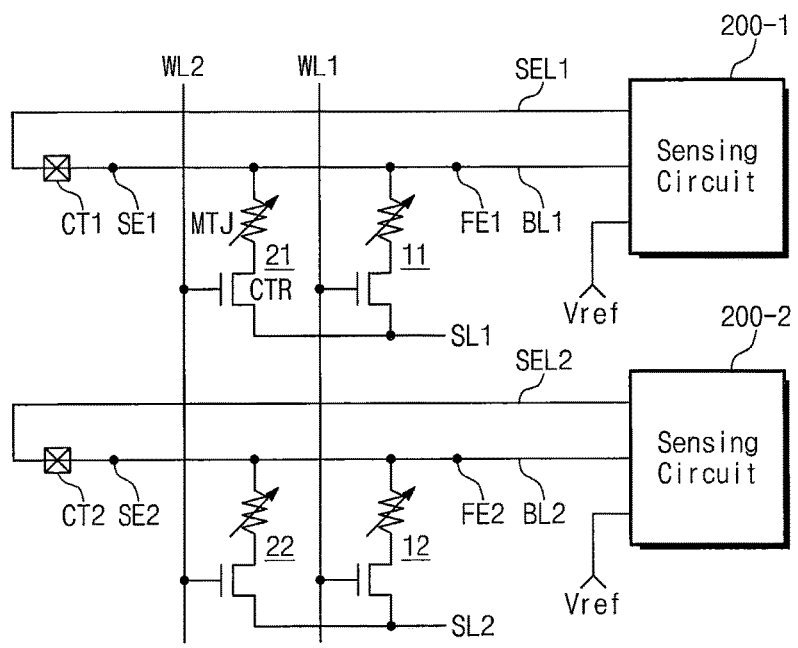
FIG. 4 is a diagram schematically illustrating an extended embodiment of the semiconductor memory device of FIG. 1.

FIG. 4 is a diagram schematically illustrating an extended embodiment of the semiconductor memory device of FIG. 1. In particular, FIG. 4 illustrates two bit lines of the memory cell array and their associated sensing circuits.

FIG. 4 shows a 2-by-2 memory cell array structure that includes two bit lines BL1 and BL2 that each have two memory cells connected thereto. Each memory cell that is connected to the bit lines BL1 and BL2 includes a Magnetic Tunnel Junction (MTJ) element and a cell transistor CTR.

The gate of each cell transistor CTR is connected to a word line, and a source thereof is connected to a source line.

A sensing circuit 200-1 is connected to a first sensing line SEL1 and to a first bit line BL1. When the first sensing line SEL1 and the first bit line are formed in different layers of the device structure, the first sensing line SEL may be connected to a second end SE1 of the first bit line BL1 via a contact CT1. The first sensing line SEL1 may be a jumping metal line that crosses above the memory cells of the memory cell array.

The 2-by-2 memory cell array structure illustrated in FIG. 4 may be extended to an N-by-M memory cell array structure (N and M being a natural number of 3 or more).

An embodiment of the inventive concepts is exemplified in FIG. 4 that includes first and second sensing lines SEL1 and SEL2. Since a loss of a sensing margin for memory cells that are in a far cell area may be reduced or eliminated, the number of memory cells connected to each bit line may be increased as compared to conventional memory devices.

Figure 5:
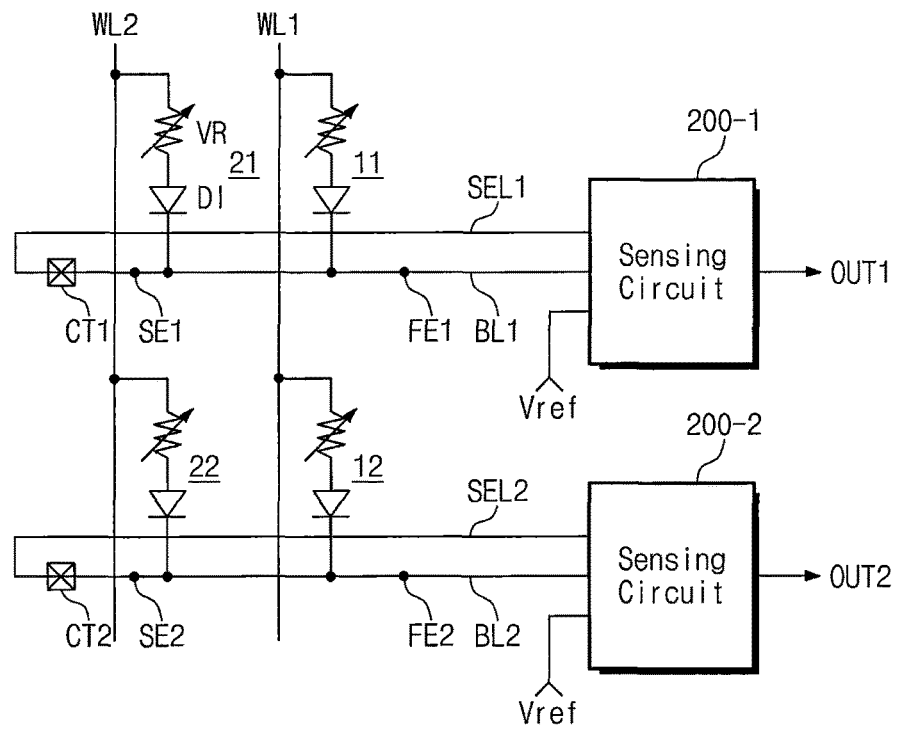
FIG. 5 is a diagram schematically illustrating another extended embodiment of the semiconductor memory device of FIG. 1.

FIG. 5 is a diagram schematically illustrating another extended embodiment of the semiconductor memory device of FIG. 1.

In particular, FIG. 5 shows a 2-by-2 memory cell array structure. In the embodiment of FIG. 5, each memory cell is a resistive memory cell that includes a variable resistor VR and a diode DI.

One end of each variable resistor VR is connected to a word line (i.e., either to WL1 or WL2). An anode of the diode DI is connected to the other end of the variable resistor VR, and a cathode thereof is connected to a bit line (i.e., either to BL1 or BL2).

A sensing circuit 200-1 is connected to a first sensing line SEL1 and to the first bit line BL1. When the first sensing line SEL1 and the first bit line BL1 are disposed at different layers of the device structure, the first sensing line SEL1 may be connected to a second end SE1 of the first bit line BL1 via a contact CT1. The first sensing line SEL1 may be a jumping metal line that crosses above the memory cells of the memory cell array.

The 2-by-2 memory cell array structure illustrated in FIG. 5 may be extended to an N-by-M memory cell array structure (N and M being a natural number of 3 or more).

Figure 6:
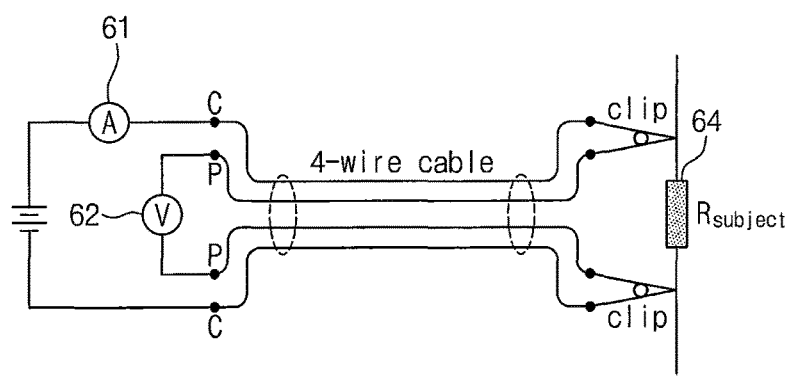
FIG. 6 is a diagram illustrating a basic principle of a data sensing method according to an exemplary embodiment of the inventive concepts.
Figure 7:
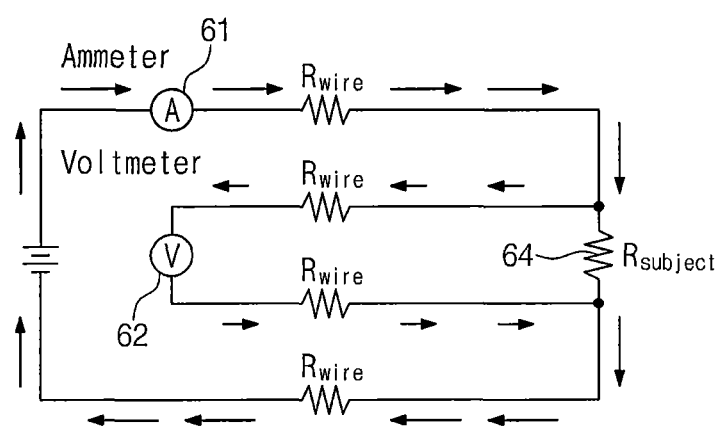
FIG. 7 is an equivalent circuit diagram corresponding to FIG. 6.

FIG. 6 is a diagram for describing a basic principle of a data sensing method according to an exemplary embodiment of the inventive concepts. FIG. 7 is an equivalent circuit diagram corresponding to FIG. 6.

In FIG. 6, there is illustrated a structure according to a Cross-Bridge Kelvin Resistor (CBKR) measurement method, which is a method for measuring a resistance value of a contact (e.g., contact 64 in FIG. 6). In the CBKR measurement method, a first pair of terminals C-C are provided that apply a current across the contact 64 and a second pair of terminals P-P are provided for measuring a voltage. The first and second pair of terminals form separate loops. Using this approach, it is possible to exactly measure a resistance value $R_{subject}$ of the contact 64 using four terminals, without influence of parasitic resistance that may be present in the measurement path.

A general resistance measurement method may be implemented using two terminals. A current is supplied to either of the two terminals, and a voltage from a voltage source is applied between both ends of a contact via the two terminals. That is, a resistance value of the contact may be measured using Ohm's law (V=IR). When this method is used, since a voltage is measured at a terminal to which a current is applied, all resistance in a path through which a current flows is reflected by the resistance measurement. Accordingly, the measured resistance value includes a resistance value of a wire cable of the voltmeter, so it is inexact.

For the CBKR measurement method, a loop for applying a current and a loop for measuring a voltage are separately formed using four terminals, so no current flows through the loop that measures the voltage. Consequently, a voltage drop does not occur.

The loop for applying the current contains a voltage source, a current meter 61, terminals C-C, and a contact 64 and may be formed along an outer path as illustrated in FIG. 7. The loop for measuring the voltage contains the contact 64, terminals P-P, and a voltmeter 62 and may be formed along an inner path as illustrated in FIG. 7.

Here, voltage drop occurs if resistance exists in a path through which a current flows. However, if no current flows through a path, voltage drop does not occur according to the ohm's law (i.e., I=0 A). If the condition that no current flows is set using such a principle, a voltage may be exactly measured even though a wire cable having a non-zero resistance is in the measurement path. If a voltage measurement loop has an infinite input resistance value, no current flows along the path for measuring the voltage. Referring to FIG. 7, since no current flows along the path for measuring a voltage, no voltage drop occurs along the measurement path. Thus, a resistance value of the contact 64 may not include the wire cable resistance $R_{wire}$ between the terminals P-P. That is, it is possible to exactly measure resistance $R_{subject}$ of the contact 64, as the parasitic resistance of the inner path will not impact the measurement.

In embodiments of the inventive concepts, a sensing circuit and a sensing method may be implemented in a semiconductor memory device (e.g., a resistive memory, etc.) using the above-described CBKR measurement method. As such, a sensing margin may be the same regardless of whether the selected memory cell is in a near cell area or a far cell area, thereby making it possible to increase the number of memory cells that are connected to a bit line.

Figure 8:
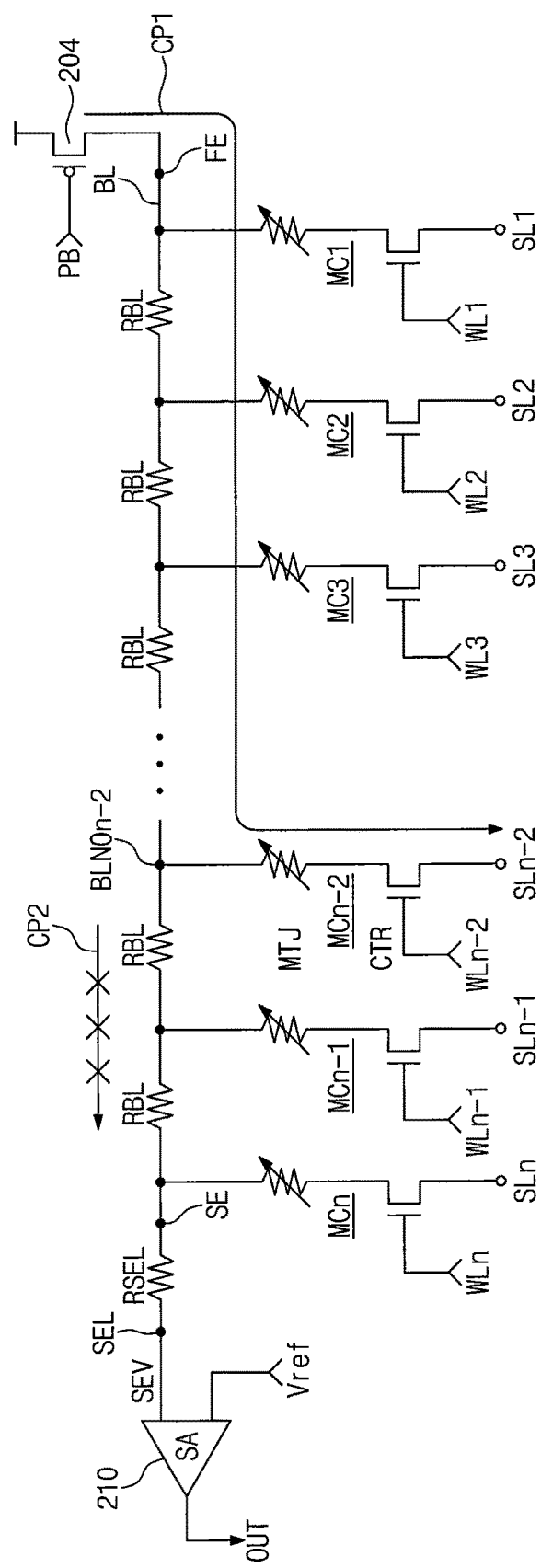
FIG. 8 is a circuit diagram for describing a data sensing method according to FIG. 2.

FIG. 8 is a diagram for describing a data sensing method according to FIG. 2.

Referring to FIG. 8, a bit line BL is illustrated that has a resistance that may be viewed as a plurality of parasitic bit line resistances RBL. In FIG. 8, it is assumed that the memory cells that are connected to the bit line BL are MRAM memory cells that each include a Magnetic Tunnel Junction (MTJ) element and a cell transistor CTR.

When the memory cell that is selected is far from a first end FE of the bit line BL, the number of bit line resistances RBL increases; therefore, a resistance value of the portion of the bit line BL between the first end FE and the selected memory cell becomes greater. For example, a resistance value of the bit line BL may be "1×RBL" when a second memory cell MC2 that is in a near cell area is selected during a read operation. In contrast, a resistance value of the bit line BL may be "n×RBL" when an n-th memory cell MCn that is in a far cell area is selected during a read operation.

According to a sensing method of the inventive concepts, a sensing margin is constantly maintained regardless of whether a selected memory cell is in a near cell area or a far cell area.

For example, in FIG. 8, if memory cell MCn−2 is selected during a read operation, a word line WLn−2 is activated, and a sensing current is supplied to the bit line via the PMOS transistor 204. The sensing current flows from the first end FE of the bit line BL to a source line SLn−2 of the n−2$^{nd}$ memory cell MCn−2 via a bit line node BLNOn−2. In detail, a current supplied to the bit line node BLNOn−2 flows to the source line SLn−2 via the MTJ element and the cell transistor CTR of the memory cell MCn−2.

Since the current flows along a path CP1 on the bit line BL, a voltage drop occurs in a direction in which a current is applied. However, since a voltage measurement circuit whose input resistance may be infinite (or at least very large), that is, the sense amplifier 210 and the remainder of the bit line BL are on a path CP2 on the bit line BL, no current flows. That is, no current flows between the bit line node BLNOn−2 and a second end SE of the bit line, so no voltage drop occurs even though the resistance may be very high. Since no current flows, the resistance of the conductive path between the bit line node BLNOn−2 and a sensing line SEL does not affect a sensing voltage SEV.

As described above, the sensing voltage SEV may be a voltage appearing at the bit line node BLNOn−2. The sense amplifier 210 senses data stored at a selected memory cell by comparing the sensing voltage SEV with a reference voltage Vref regardless of a location of the selected memory cell. Thus, the sensing operation may only sense the resistance state of the selected memory cell, regardless of whether a first memory cell MC1 or an n-th memory cell MCn is selected. Sensing data OUT is output as a result of the sensing operation.

Accordingly, reduction in sensing margin may be reduced or prevented with respect to memory cells that are in a far cell area by providing a sensing line SEL for each bit line BL and separating a point where a sensing current is applied and a point where a sensing voltage is measured. Thus, it possible to increase the number of memory cells that are connected to a bit line.

Figure 9:
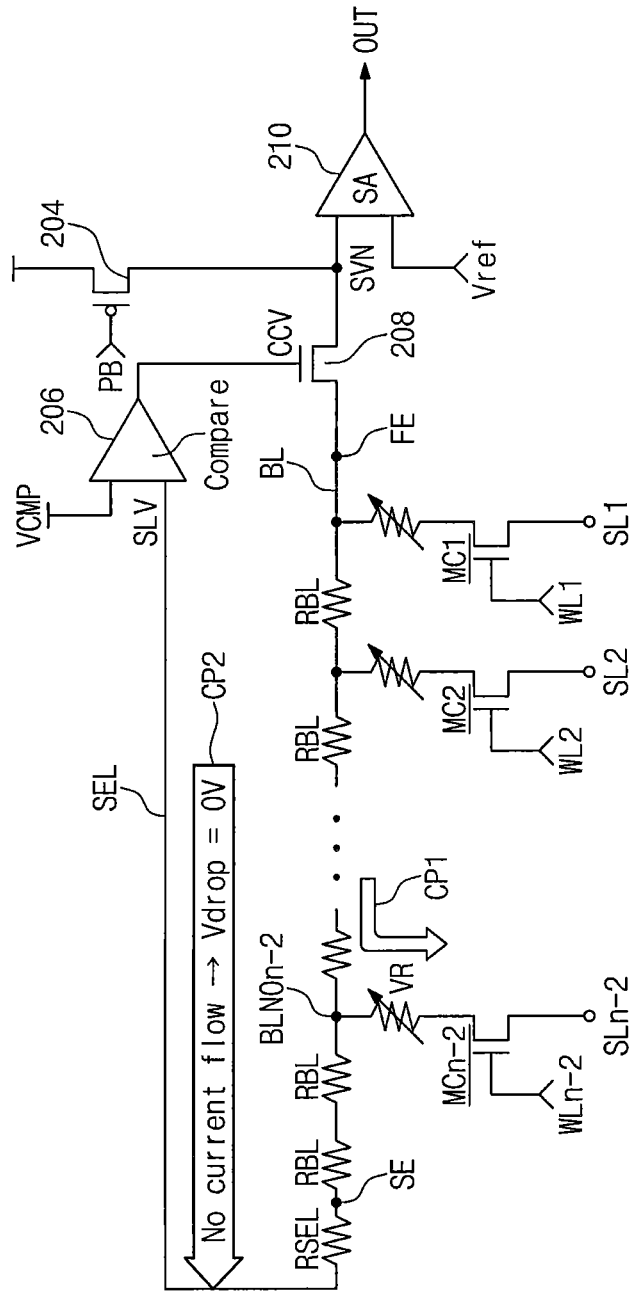
FIG. 9 is a circuit diagram for describing a data sensing method according to FIG. 3.

FIG. 9 is a diagram for describing a data sensing method according to FIG. 3.

Referring to FIG. 9, there is illustrated a structure for solving sensing margin loss between a near cell and a far cell by applying a basic principle of a CBKR measurement method to a sensing circuit that includes a clamping transistor 208.

In FIG. 9, the sensing circuit contains the clamping transistor 208, a comparator 206, a bias transistor 204 and a sense amplifier 210. The sense amplifier 210 is a voltage sense amplifier such as, for example, a cross-coupled differential amplifier or a current-mirror differential amplifier.

It is assumed that 1024 memory cells are connected to a bit line BL and that the 1022-th memory cell MCn−2 on the bit line is selected, which is very far from a first end FE of the bit line BL (i.e., the 1022-th memory cell MCn−2 is in the far cell area and is located very close to the second end SE of the bit line BL).

A word line WLn−2 is enabled, and the bias transistor 204 supplies a predetermined sensing current to a sensing voltage node SVN. The sensing current may be set to an intermediate current value that is in between a current value that flows when the memory cell is programmed to a high-resistance state and a current value that flows when the memory cell is programmed to a low-resistance state. For example, a current of about 3 μA may be supplied as the sensing current when a current of 1 μA flows when a memory cell is at a high-resistance state and a current of 5 μA flows when a memory cell is at a low-resistance state. In this case, a voltage of about 3 V may appear at the sensing voltage node SVN as an initial voltage.

The sensing current is limited by the clamping transistor 208 and is then supplied to the first end FE of the bit line. A voltage of the bit line node BLNOn−2 that is connected to the 1022-th memory cell MCn−2 becomes equal to a predetermined clamping voltage VCMP because the clamping transistor 208 adjusts the sensing current in response to a clamping control voltage CCV. A level of the clamping voltage VCMP may be set to be lower than a voltage level of the sensing voltage node SVN. For example, the clamping voltage VCMP may range from 0.3 V to 2 V.

A sensing current clamped by the clamping transistor 208 flows from the first end FE of the bit line BL to a source line SLn−2 of the selected memory cell MCn−2 along a current path CP1, but it does not flow from the bit line node BLNOn−2 to the second end SE due to the infinite input resistance existing on this portion of the bit line BL. That is, no current flows along the path CP2.

The comparator 206 compares the clamping voltage VCMP and a sensing line voltage SLV appearing at the sensing line SEL and generates the clamping control voltage CCV according to a result of the comparison. Accordingly, if the clamping voltage VCMP is set to 2 V, then a voltage of the bit line node BLNOn−2 is limited to 2 V as a control target voltage. In this case, the first end FE may have a voltage (e.g., 2.5 V) higher than a voltage of the bit line node BLNOn−2. The clamping control voltage CCV generated from the comparator 206 when a first memory cell MC1 is selected is lower than that when the 1022-th memory cell MCn−2 is selected. In this case, since the clamping transistor 208 is weakly turned on, a voltage of the first end FE may be limited to 2 V.

The comparator 206 and the clamping transistor 208 constitute a means for setting a voltage of a bit line node that is connected to a selected memory cell to the clamping voltage VCMP regardless of whether a memory cell that is in a near cell area is selected or a memory cell that is in a far cell area is selected. Accordingly, the clamping control voltage CCV that is generated when a memory cell in the near cell area is selected may be higher than that when a memory cell in the far cell area is selected.

As described above, a clamped sensing current does not flow between the bit line node BLNOn−2 and the sensing line SEL due to the infinite input impedance, so a voltage drop does not occur between the bit line node BLNOn−2 and the sensing line SEL. Accordingly, the sensing line voltage SLV may be equal to a voltage of the bit line node BLNOn−2. On the same principle, when a first memory cell MC1 is selected, a voltage of a bit line node appearing at the first end FE becomes equal to a predetermined clamping voltage VCMP; therefore, a sensing current does not flow between the first end FE and the sensing line SEL.

Accordingly, a voltage of the sensing voltage node SVN of the sense amplifier 210 may be based only on a resistance state of a selected memory cell, regardless of whether the selected memory cell is in a near cell area or a far cell area. When a selected memory cell is at a low-resistance state, a relatively large sensing current flows toward a source line; therefore, a voltage lower than 3 V (initial voltage) appears at the sensing voltage node SVN. When a selected memory cell is at a high-resistance state, a relatively small sensing current flows toward the source line; therefore, a voltage lower than 3 V (initial voltage) appears at the sensing voltage node SVN. The sense amplifier 210 compares a voltage of the sensing voltage node SVN with a reference voltage Vref at a sensing time and outputs sensing data OUT as a result of the comparison.

The measured voltage is fed back via a sensing line SEL that is connected to a second end SE of a selected bit line BL, and a clamped sensing current does not flow between a bit line node of a selected memory cell and the sensing line SEL. Accordingly, a resistance value between a bit line node (e.g., BLNOn−2) and the sensing line SEL may not affect the voltage measurement.

Sensing margin loss between a near cell and a far cell may be reduced or eliminated by implementing the sensing circuit according to a sensing principle described with reference to FIG. 9. Since a sensing margin between a near cell and a far cell may be constantly maintained, the number of memory cells connected to the bit line may be increased. According to a sensing circuit shown in FIG. 9, a data sensing margin is constantly secured regardless of a bit line loading difference between a near cell and a far cell, thereby increasing memory capacity, with a sensing speed considered.

Figure 10:
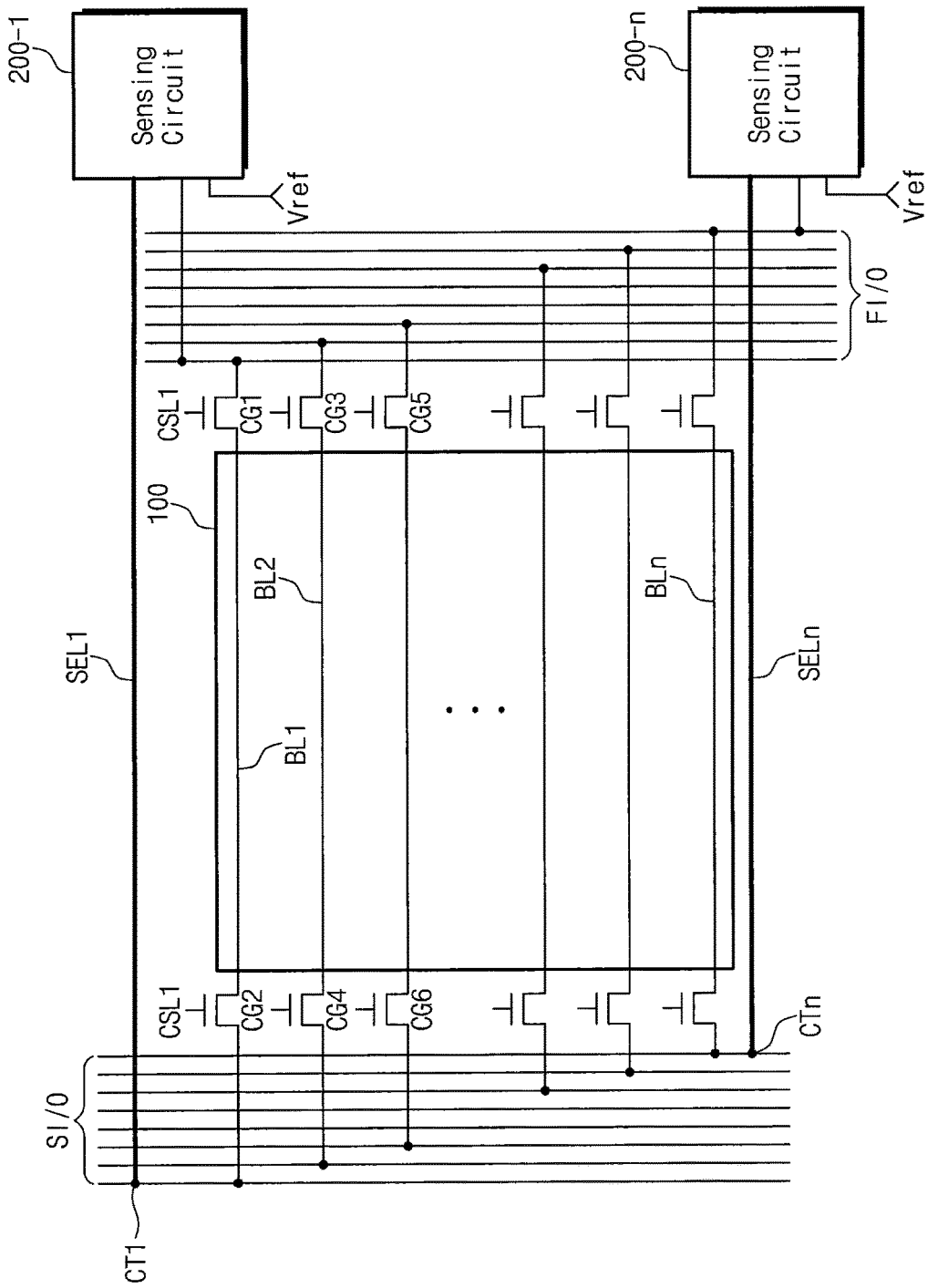
FIG. 10 is a diagram schematically illustrating an extended embodiment of the semiconductor memory device of FIG. 4.

FIG. 10 is a diagram schematically illustrating an extended embodiment of the semiconductor memory device of FIG. 4.

Referring to FIG. 10, if sensing circuits 200-1 and 200-2 are placed at the right on the drawing basis, a second column gate unit including column gates CG2, CG4, and CG6, a second local I/O line unit SI/O, and sensing lines SEL1 to SELn are added at the left side of the drawing. A first column gate unit including column gates CG1, CG3, and CG5 and a first local I/O line unit FI/O are default components.

For example, a first column selection line signal CSL1 is enabled when a memory cell connected to a first bit line is selected.

As the first column gate CG1 is turned on by the first column selection line signal CSL1, a sensing current is supplied from a bit line to a selected memory cell. As the second column gate CG2 is turned on by the first column selection line signal CSL1, a sensing voltage is transferred via the first selecting line SEL1.

Since the second column gate CG2 is not a current driving transistor, a size of the second column gate CG2 may be smaller than a size of the first column gate CG1. Accordingly, the second column gate unit may be implemented in an area smaller than the first column gate unit.

A voltage measured via the second column gate CG2 that is connected to a first bit line BL1 is transferred to a comparator 206 (refer to FIG. 3) in the sensing circuit 200-1 via a local I/O line corresponding to a second local I/O line unit SI/O and the sensing line SEL1 may be a jumping metal line. The voltage measurement may be performed at a location opposite to a location where a sensing current is applied, to prevent influence of resistance of a bit line path on the voltage measurement.

Figure 11:
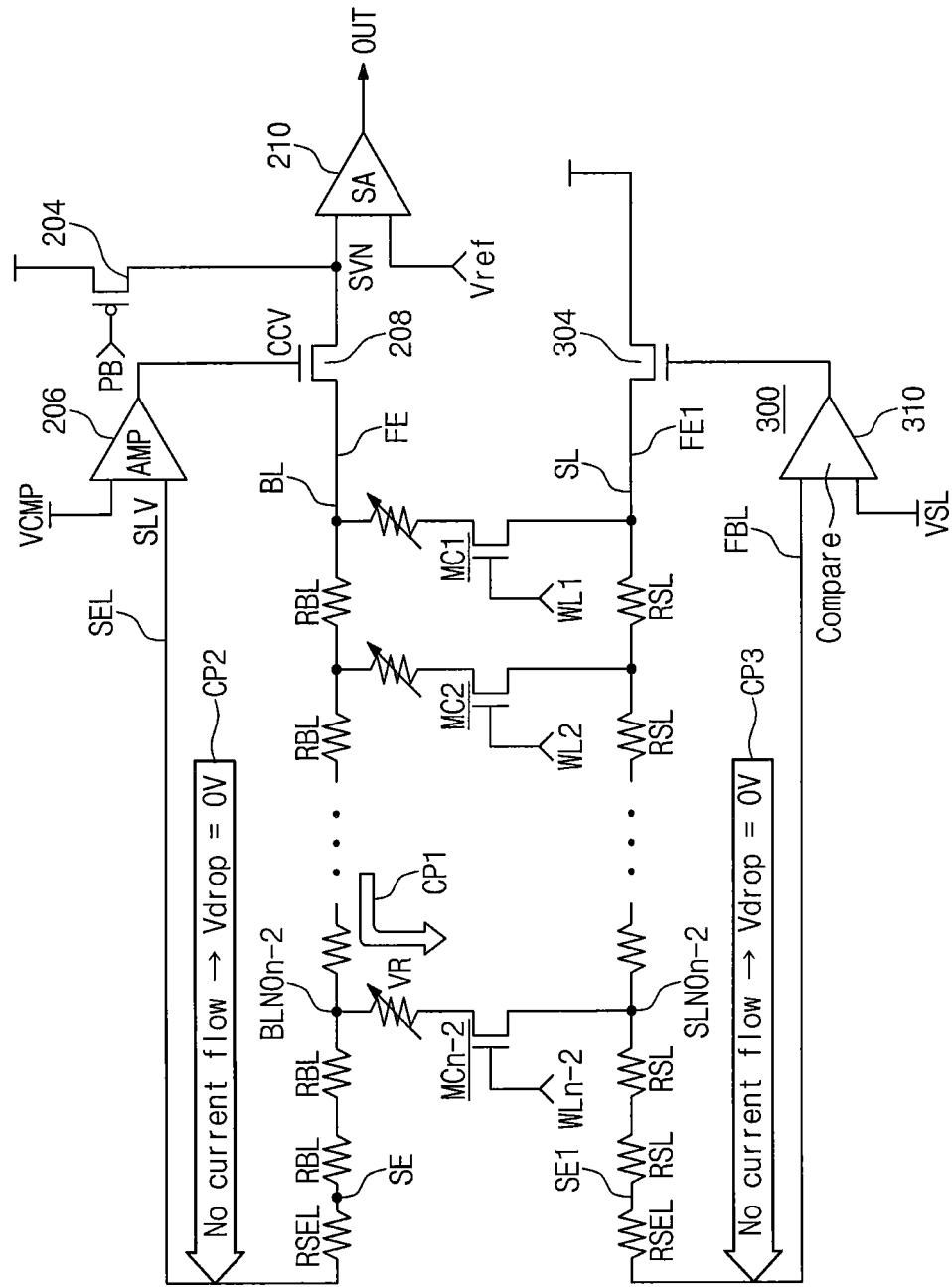
FIG. 11 is a diagram schematically illustrating a modified version of the data sensing method that is described with reference to FIG. 9.

FIG. 11 is a diagram schematically illustrating a modified embodiment of the semiconductor memory device of FIG. 9.

In FIG. 11, a source line driving circuit 300 is added as compared to the embodiment of FIG. 9.

Referring to FIG. 11, a source line SL is connected in common with sources of memory cells MC1 to MCn that are connected between a first end FE1 and a second end SE1 of the source line SL. Here, the first end FE1 of the source line SL is closer to the source line driving circuit 300 than the second end SE1.

Since parasitic resistance exists along the source line SL, a source line in a memory cell array may be driven in the same principle as a bit line voltage measurement principle described with reference to FIG. 9. For this, a feedback line FBL is connected to the second end SE1 of the source line SL. The feedback line FBL corresponds to the sensing line SEL.

The source line driving circuit 300 adjusts a driving current flowing to the source line SL based on a difference between a feedback voltage of the feedback line FBL and a predetermined source line reference voltage VSL.

The source line driving circuit 300 contains a source line current supplying unit 304 and a source line driving control unit 310. The source line current supplying unit 304 supplies the driving current to the source line SL via the first end FE1 of the source line SL in response to a driving control signal. The source line driving control unit 310 compares the feedback voltage and the source line reference voltage VSL to generate the driving control signal.

In FIG. 11, the source line current supplying unit 304 may be implemented as an NMOS transistor, and the source line driving control unit 310 may be a comparator. The comparator may be implemented as an operational amplifier in some embodiments.

When a memory cell MCn−2 is selected, a resistance value of the portion of the source line and the feedback line that are between a source line node SLNOn−2 and the comparator 310 does not impact operation of the comparator 310. That is, since no current flows along a path CP3, a voltage of the feedback line FBL may be equal to a voltage of the source line node SLNOn−2 since no voltage drop will occur along the path CP3.

For an MRAM, source line resistance as well as bit line resistance may be very important in stabilizing cell distribution. Problems due to an increase in source line resistance are solved by applying the source line driving circuit 300 shown in FIG. 11 to a source line. In particular, it is possible to cope with an increase in line resistance due to an increase in the degree of integration effectively, thereby making it possible to remove a factor causing a decrease in a cell size due to an increase in source line resistance. As an increase in bit line resistance and source line resistance may be solved using a circuit shown in FIG. 11, the number of memory cells connected to each bit line may be increased.

Figure 12:
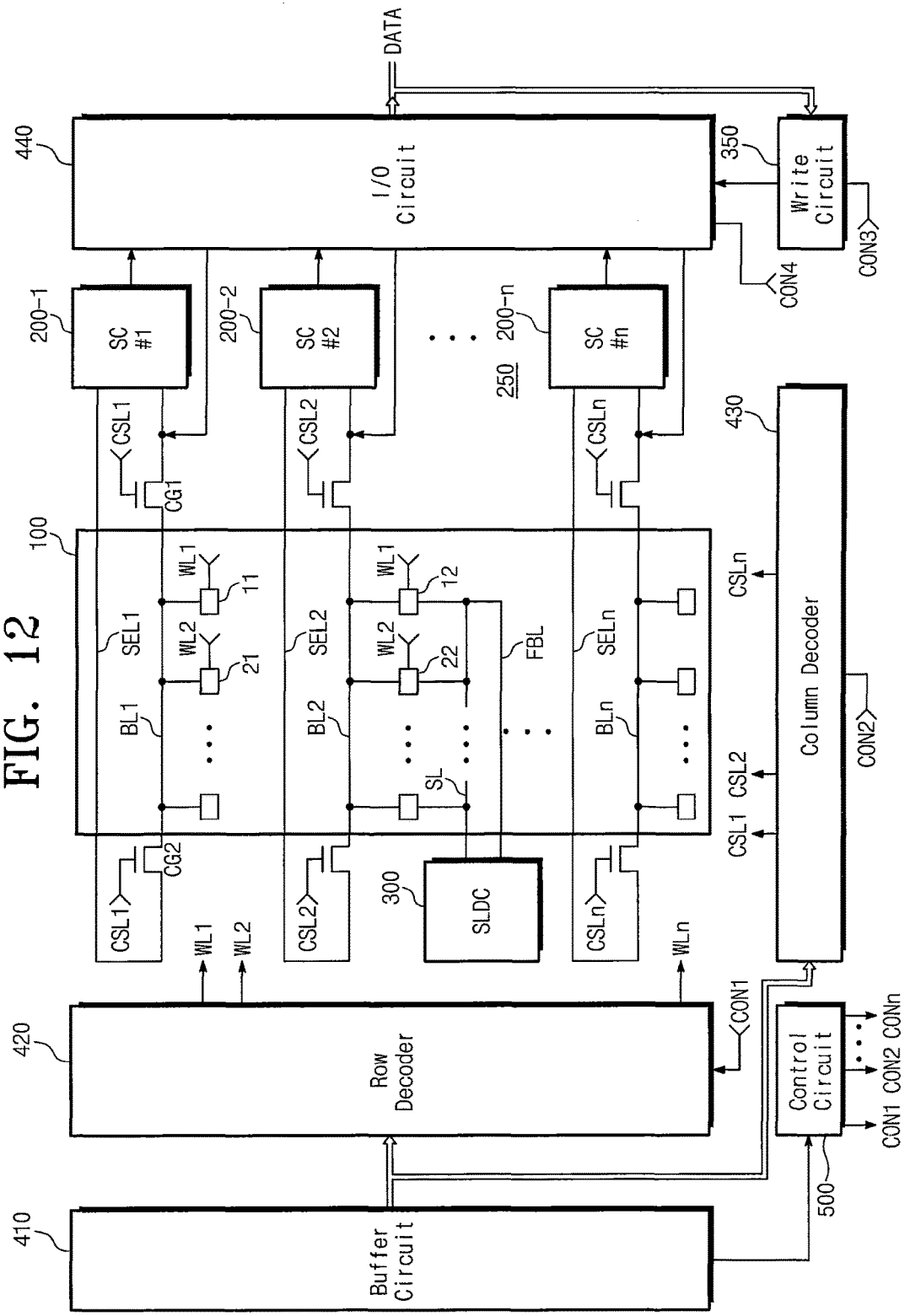
FIG. 12 is a block diagram schematically illustrating a semiconductor memory device according to an exemplary embodiment of the inventive concepts.

FIG. 12 is a block diagram schematically illustrating a semiconductor memory device according to another exemplary embodiment of the inventive concepts.

Referring to FIG. 12, the semiconductor memory device contains a memory cell array 100, a sensing circuit unit 250, a source line driving circuit 300, a write circuit 350, a buffer circuit 410, a row decoder 420, a column decoder 430, an input/output (I/O) circuit 440, and a control circuit 500.

The memory cell array 100 is connected to the row decoder 420 via a plurality of word lines WL1, WL2, . . . WLn. The memory cell array 100 is connected to sensing circuits 200-1 to 200-n of the sensing circuit unit 250 via a plurality of bit lines BL1 to BLn. The memory cell array 100 includes a plurality of memory blocks, each of which includes a plurality of memory cells for storing data.

In exemplary embodiments, the memory cell array 100 may be a resistive memory and implemented using a variable resistance memory. For example, memory cells of the memory cell array 100 may be STT-MRAM (Spin Transfer Torque-Magnetic Random Access Memory) cells.

If the memory cells are formed of STT-MRAM cells, each memory cell may include a Magnetic Tunnel Junction (MTJ) element having a magnetic material.

During a write operation, the write circuit 350 provides a write current corresponding to write-requested data to the memory cell array 100 via a selected bit line BL.

Each of the sensing circuits 200-1 to 200-n may be implemented, for example, as described above with reference to FIG. 2 or 3. During a read operation on a memory cell that is connected to bit line BL1, the sensing circuit 200-1 injects a sensing current onto the bit line BL1 and receives a sensing voltage via a sensing line SEL1 through which no current flows. Accordingly, the sensing circuit 200-1 performs a sensing operation with the same sensing margin regardless of a location of the selected memory cell along the bit line BL1.

The input/output circuit 440 receives data from an external device that is to be written to the memory cell array 100 or outputs data read from memory cells of the memory cell array 100 to the external device.

The column decoder 430 decodes a column address to output a column selection line signal for selecting one of the plurality of bit lines.

The row decoder 420 decodes a row address to output a word line activation signal for selecting one of the plurality of word lines.

The control circuit 500 receives a write command W_CMD or a read command R_CMD and generates control signals CON1 to CONn for controlling each circuit block of the semiconductor memory device. The control circuit 500 controls a read or write operation of the semiconductor memory device in response to the write command or the read command.

The buffer circuit 410 may contain an address buffer and a command buffer. The address buffer multiplexes an input address to provide a row address and a column address to the row decoder 420 and the column decoder 430, respectively.

The source line driving circuit 300 is connected to a source line of memory cells. In this case, the source line driving circuit 300 may have the same structure as illustrated in FIG. 11.

In the embodiment of FIG. 12, as described with reference to FIG. 10, a second column gate unit including a column gate CG2, a sensing circuit unit 250, and sensing lines SEL1 to SELn are added to the general circuit structure. Also, a feedback line FBL is added when the source line driving circuit 300 is added.

Figure 13:
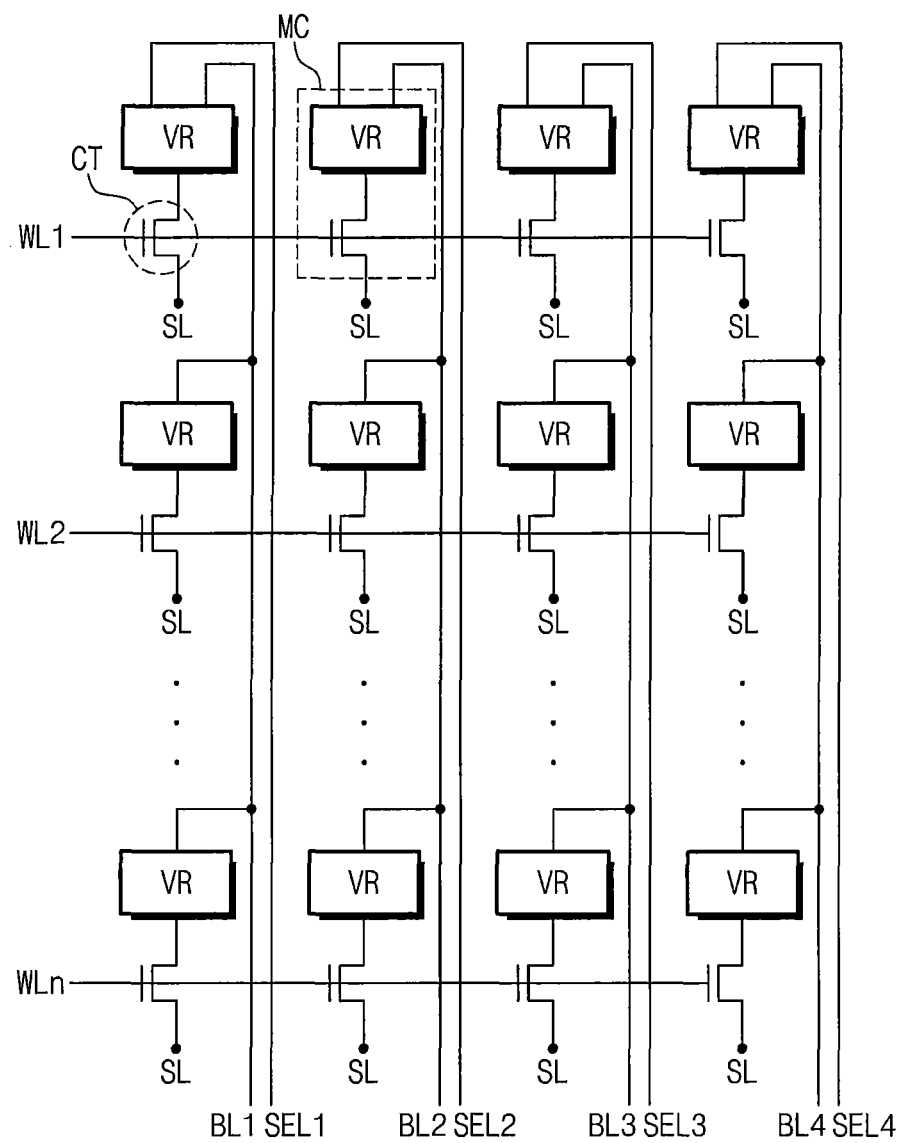
FIG. 13 is a diagram schematically illustrating a block of a memory cell array of the semiconductor memory device of FIG. 12.

FIG. 13 is a diagram schematically illustrating a memory cell block of the memory cell array 100 of FIG. 12.

To simplify the description, the embodiment of the inventive concepts is exemplified in FIG. 13 as a memory cell block that is connected to four bit lines BL1 to BL4. In this case, four sensing lines SEL1 to SEL4 are provided that correspond to the four bit lines BL1 to BL4. The four bit lines BL1 to BL4 and the four sensing lines SEL1 to SEL4 may be connected to corresponding sensing circuits such as the sensing circuits shown in FIG. 2 or the sensing circuit shown in FIG. 3. Sensing currents are applied via the four bit lines BL1 to BL4, and voltages are measured via the four sensing lines SEL1 to SEL4.

Referring to FIG. 13, the memory cell block contains a plurality of memory cells MC. Each memory cell MC includes a variable resistance element VR and a cell transistor CT.

A resistance value of each variable resistance element VR will vary based on a direction and magnitude of an input current (or voltage). Also, the resistance value of the variable resistance element VR is maintained after the current (or voltage) is cut-off. That is, the variable resistance element VR has a nonvolatile memory characteristic.

The variable resistance element VR may be implemented using various elements. For example, the variable resistance element VR may be implemented using an STT-MRAM element. In other exemplary embodiments, the variable resistance element VR may be implemented using a Phase change RAM (PRAM) using a phase change material, a Resistive RAM (ReRAM) using a variable resistance material such as complex metal oxide, or a Magnetic RAM (MRAM) using a ferromagnetic material.

A gate of the cell transistor CT is connected to a word line WL. The cell transistor CT is switched on or off by a signal that is provided via the word line WL. A drain of the cell transistor CT is connected to the variable resistance element VR, and a source thereof is connected to a source line SL.

For example, in some embodiments, the sources of the cell transistors of the memory cells MC may all be connected to the same source line. In other exemplary embodiments, sources of the cell transistors of the memory cells MC may be connected to different source lines, respectively.

Figure 14:
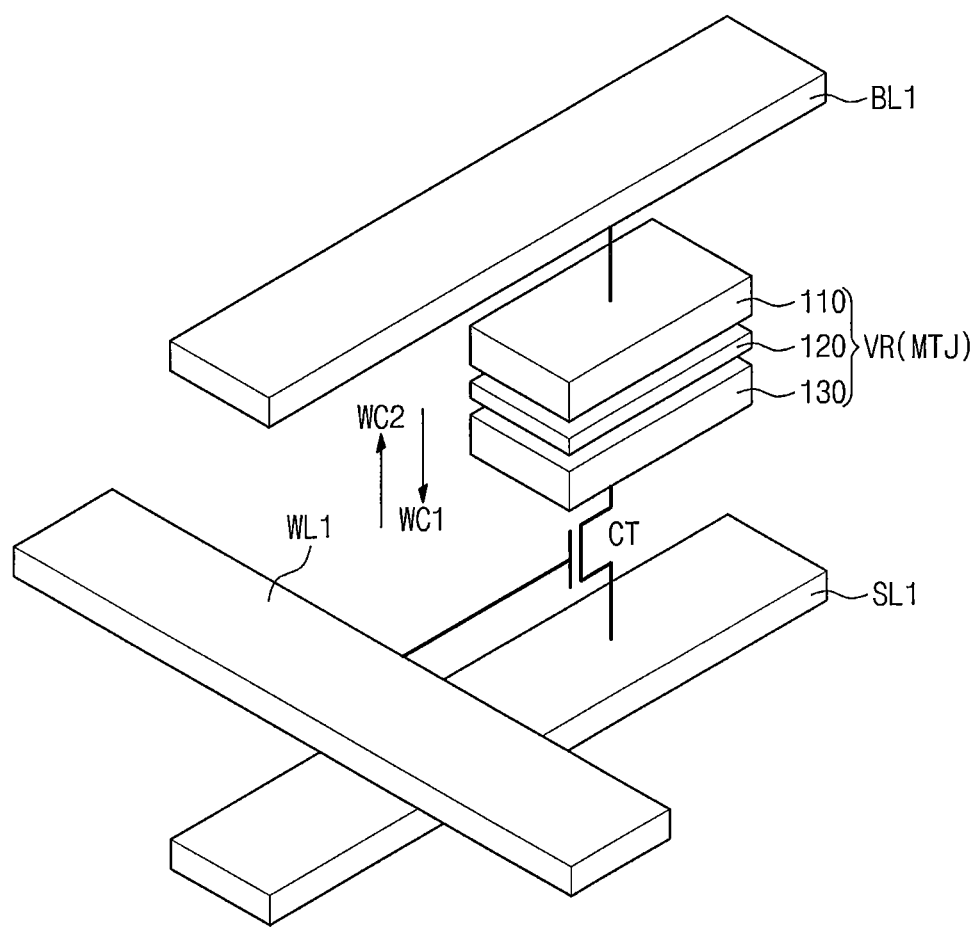
FIG. 14 is a diagram schematically illustrating a structure of a memory cell of the memory cell array of FIG. 13.

FIG. 14 is a diagram schematically illustrating a structure of one of the memory cells of FIG. 13 according to one exemplary embodiment of the inventive concepts. In the embodiment of FIG. 14, the memory cell MC is implemented as an STT-MRAM cell.

As shown in FIG. 14, the memory cell MC includes a variable resistance element VR and a cell transistor CT. A gate of the cell transistor CT is connected to a word line (e.g., a first word line WL1), one electrode thereof to a bit line (e.g., a first bit line BL1) through the variable resistance element VR, and the other electrode thereof to a source line (e.g., a first source line SL1).

The MTJ variable resistance element VR includes a pinned layer 130, a free layer 110, and a tunnel layer 120 interposed between the pinned layer 130 and the free layer 110. A magnetization direction of the pinned layer 130 is pinned. A magnetization direction of the free layer 110 is equal or opposite to that of the fixed layer 130 according to a condition. An anti-ferromagnetic layer (not shown) may be further provided to pin a magnetization direction of the pinned layer 130.

During a read operation of the STT-MRAM cell, a high-level voltage may be applied to the word line WL1 to turn on the cell transistor CT, and a read current may be provided in a direction from the bit line BL1 to the source line SL. At this time, a voltage is measured via a sensing line connected to a second end of the bit line BL1. With this sensing method, data stored at the variable resistance element VR may be more exactly determined regardless of whether a selected memory cell is a near cell or a far cell.

During a write operation of the STT-MRAM cell, a high-level voltage may be applied to the word line WL1 to turn on the cell transistor CT, and a write current may be provided between the bit line BL1 and the source line SL. Accordingly, a resistance value of the variable resistance element VR varies with a magnetization direction of the free layer 110.

Figure 15:
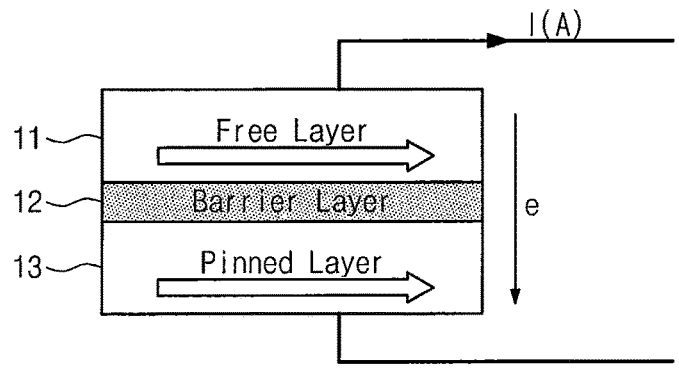
FIGS. 15 and 16 are diagrams illustrating a magnetization direction of a variable resistance element as a function of the data stored in the memory cell of FIG. 14.
Figure 16:
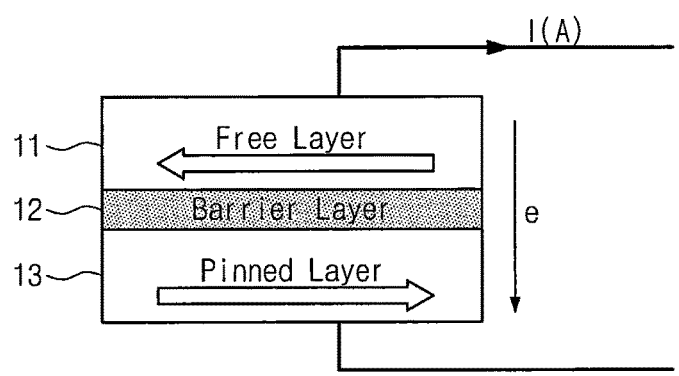

FIGS. 15 and 16 are diagrams illustrating a magnetization direction of a variable resistance element according to data stored at a memory cell of FIG. 14.

Referring to FIG. 15, a magnetization direction of a free layer 11 and a magnetization direction of a pinned layer 13 are parallel with each other. Accordingly, the variable resistance element has a small resistance value. In this case, data is read, for example, as being "0".

Referring to FIG. 16, magnetization directions of free and pinned layers 11 and 13 may be anti-parallel (or opposite each other). Thus, the variable resistance element has a large resistance value. In this case, data is read, for example, as being "1".

In FIGS. 15 and 16, an embodiment of the inventive concepts is exemplified where the free and pinned layers 11 and 13 of the memory cell are horizontal magnetic elements. However, the scope and spirit of the inventive concepts are not limited thereto. For example, the free and pinned layers 11 and 13 can be implemented using vertical magnetic elements.

Figure 17:
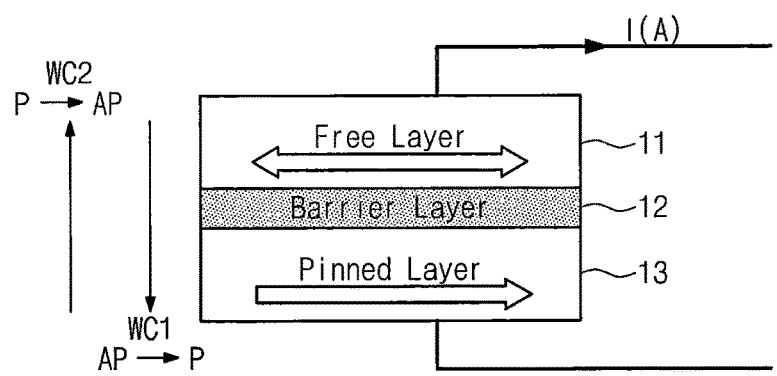
FIG. 17 is a diagram for describing a write operation to an STT-MRAM cell of FIG. 14.

FIG. 17 is a diagram for describing a write operation in which data is written to the STT-MRAM cell of FIG. 14.

Referring to FIG. 17, a magnetization direction of a free layer 11 may be decided according to a direction of a write current WC1/WC2 flowing via a variable resistance element VR. For example, if a first write current WC1 is applied, free electrons having the same spin direction as a pinned layer 13 may force a torque to the free layer 11. At this time, the free layer 11 and the pinned layer 13 may be magnetized in parallel.

Meanwhile, when a second write current WC2 is applied, electrons having a spin direction opposite to that of the fixed layer 13 may force a torque to the free layer 11. At this time, the free layer 11 is magnetized in a direction opposite to that of the fixed layer 13. That is, in the variable resistance element VR, a magnetization direction of the free layer 11 is changed by a spin transfer torque (STT).

The free layer 11 may include a material having a variable magnetization direction. A magnetization direction of the free layer 11 may be changed by an internal or external electrical/magnetic factor of a memory cell.

The free layer 11 may contain a ferromagnetic material including at least one of Co, Fe, or Ni. For example, the free layer 11 may contain at least one material selected from a group of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and Y3Fe5O12.

A thickness of the tunnel layer 12 as a barrier layer may be smaller than a spin diffusion distance. The tunnel layer 12 may contain a nonmagnetic material. For example, the tunnel layer 12 may contain at least one selected from a group of Mg oxide, Ti oxide, Al oxide, Mg—Zn oxide, Mg—B oxide, Ti nitride, and V nitride.

The pinned layer 13 may be of a magnetization direction that is fixed by a pinning layer (not shown). The pinned layer 13 may also contain a ferromagnetic material. For example, the pinned layer 13 may contain at least one selected from a group of CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and Y3Fe5O12. Meanwhile, the pinned layer may contain an anti-ferromagnetic material. For example, the pinned layer may contain at least one material selected from a group of PtMn, IrMn, MnO, MnS, MnTe, MnF2, FeCl2, FeO, CoCl2, CoO, NiCl2, NiO, and Cr.

Meanwhile, to implement the variable resistance element VR having a vertical magnetization direction, the free layer 11 and the pinned layer 13 may be formed of a material having large magnetic anisotropy energy. The material having large magnetic anisotropy energy includes amorphous rare earth element alloys, a multi-layer thin film such as (Co/Pt)n or (Fe/Pt)n, and a super-lattice material of L10 crystalline structure.

For example, the free layer 11 may be formed of an ordered alloy and may include at least one of iron (Fe), nickel (Ni), palladium (Pd), and platinum (Pt). The free layer 11 may include at least one material selected from a group of Fe—Pt alloy, Fe—Pd alloy, Co—Pd alloy, Co—Pt alloy, Fe—Ni—Pt alloy, Co—Fe—Pt alloy, and Co—Ni—Pt alloy, for example. The alloys are expressed by quantitative chemistry and are Fe50Pt50, Fe50Pd50, Co50Pd50, Co50Pt50, Fe30Ni20Pt50, Co30Fe20Pt50, or Co30Ni20Pt50.

The pinned layer 13 may be formed of an ordered alloy and may include at least one of iron (Fe), cobalt (Co), nickel (Ni), palladium (Pd), and platinum (Pt). For example, the pinned layer 13 may include at least one material selected from a group of Fe—Pt alloy, Fe—Pd alloy, Co—Pd alloy, Co—Pt alloy, Fe—Ni—Pt alloy, Co—Fe—Pt alloy, and Co—Ni—Pt alloy. The alloys are expressed by quantitative chemistry and are Fe50Pt50, Fe50Pd50, Co50Pd50, Co50Pt50, Fe30Ni20Pt50, Co30Fe20Pt50, or Co30Ni20Pt50.

A structure of layers of the STT-MRAM cell may be variously changed or modified, and materials of the free layer, the tunnel layer, and the pinned layer may be variously changed or combined.

Figure 18:
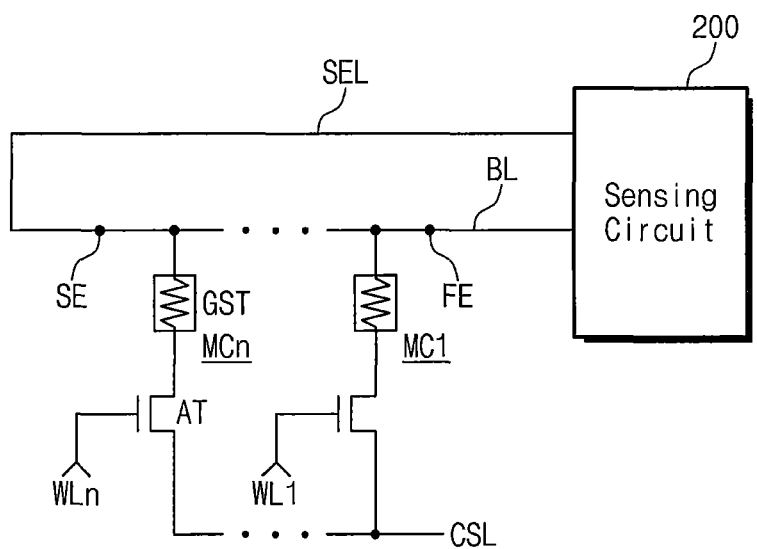
FIG. 18 is a block diagram schematically illustrating the semiconductor memory device of FIG. 1 applied to a PRAM.

FIG. 18 is a block diagram schematically illustrating the semiconductor memory device of FIG. 1 with the memory cells implemented as PRAM memory cells.

Referring to FIG. 18, a PRAM memory cell array contains a plurality of memory cells MC1 and MCn that are connected to a bit line BL. For the sake of description, one bit line BL is illustrated in FIG. 18. However, the scope and spirit of the inventive concepts are not limited thereto. That is, the memory cell array may include a plurality of bit lines, and each bit line may be connected to n memory cells (n being a natural number of 2 or more).

The memory cells MC1 and MCn are connected between a first end FE and a second end SE of the bit line BL. A memory cell MC is formed of a GST (Ge—Sb—Te) element and an access transistor AT. A gate of the access transistor AT is connected to a word line, and a source thereof is connected to a common source line CSL. In other embodiments, the access transistor AT may be replaced with a PN junction diode.

The GST element may be programmed between an amorphous state that has relatively high resistivity and a crystalline state that has relatively low resistivity. The GST element may be programmed by heating the GST element. Whether the GST element remains at an amorphous state or a crystalline state may be determined according to the magnitude and duration of the heating. A high resistance value and a low resistance value indicate a programmed value "1" and a programmed value "0", respectively. A programmed value is sensed by measuring a resistance value of the GST element.

The GST element of the memory cell may include a phase change layer, which is formed of a GST material, that is between a top electrode and a bottom electrode. A pulse current flows via the bottom electrode when applied to the memory cell MC. When the pulse current is applied to the memory cell MC for a very short time, only a layer adjacent to the bottom electrode is heated. At this time, a portion of the phase change layer may be set to an amorphous state (or "SET" state) or a crystalline state (or "RESET" state) according to a difference between heating profiles.

A sensing line SEL is provided to secure a constant sensing margin regardless of whether a selected memory cell is in the near cell area or the far cell area. The sensing line SEL is connected to the second end SE of the bit line BL.

A sensing circuit 200 is connected to the sensing line SEL and the bit line BL and receives a predetermined reference voltage Vref. The sensing circuit 200 supplies a sensing current to the bit line BL via the first end FE of the bit line BL.

The sensing circuit 200 senses data stored at a selected one of the memory cells using a sensing line voltage of the sensing line SEL.

As the bit line BL that supplies the sensing current is separate from the sensing line SEL that receives the sensing voltage, a sensing margin of an n-th memory cell MCn that is in a far cell area may be substantially the same as a sensing margin of a first memory cell MC1 that is in a near cell area. A sensing margin is constantly maintained regardless of whether a selected memory cell is in the near cell area or the far cell area, thereby increasing a memory capacity of the PRAM.

Figure 19:
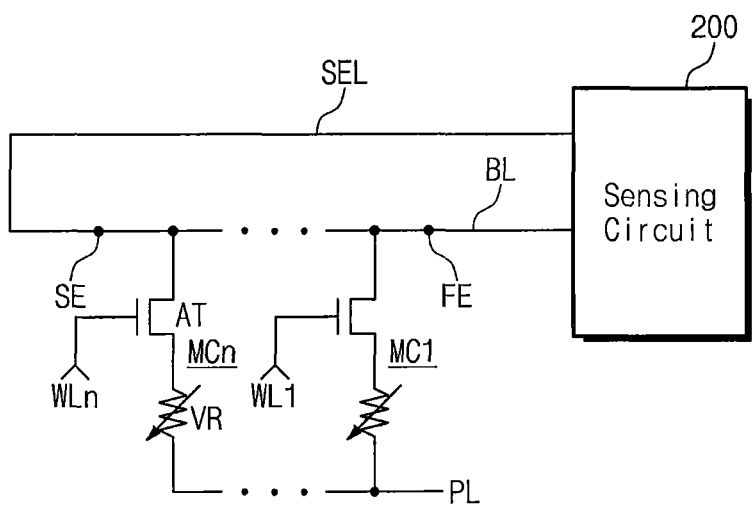
FIG. 19 is a block diagram schematically illustrating the semiconductor memory device of FIG. 1 applied to a ReRAM.

FIG. 19 is a block diagram schematically illustrating a semiconductor memory device of FIG. 1 with the memory cells implemented as ReRAM memory cells.

Referring to FIG. 19, the ReRAM memory cell array contains a plurality of memory cells MC1 and MCn that are connected to a bit line BL. For the sake of description, one bit line BL is illustrated in FIG. 19. However, the scope and spirit of the inventive concepts are not limited thereto. That is, the memory cell array may include a plurality of bit lines, and each bit line may have n memory cells (n being a natural number of 2 or more) connected thereto.

The memory cells MC1 and MCn are connected between a first end FE and a second end SE of the bit line BL. A memory cell MC is formed of a variable resistance element VR and an access transistor AT. A gate of the access transistor AT is connected to a word line, and a drain thereof is connected to the bit line BL. One end of the variable resistance element VR is connected to a source of the access transistor AT, and the other end thereof is connected to a plate line PL.

Like the semiconductor memory device of FIG. 18, the semiconductor memory device of FIG. 19 includes a sensing line SEL and a sensing circuit 200.

The sensing line SEL is provided to remove sensing margin loss between a near cell and a far cell and secure a constant sensing margin for the sensing circuit 200, and is connected between a second end SE of the bit line BL and the sensing circuit 200.

The sensing circuit 200 is connected to the sensing line SEL and the bit line BL and receives a predetermined reference voltage Vref. The sensing circuit 200 supplies a sensing current to the bit line BL via a first end FE of the bit line BL.

The sensing circuit 200 is implemented as illustrated in FIG. 2 or 3. Accordingly, the sensing circuit 200 senses data stored at a selected one of the memory cells without sensing margin loss.

According to a method where sensing is performed under the condition that a line BL for supplying a sensing current and a line SEL for receiving a sensing voltage are separated, a sensing margin is constantly maintained regardless of whether a selected memory cell is in the near cell area or the far cell area, thereby increasing a memory capacity of the ReRAM.

Figure 20:
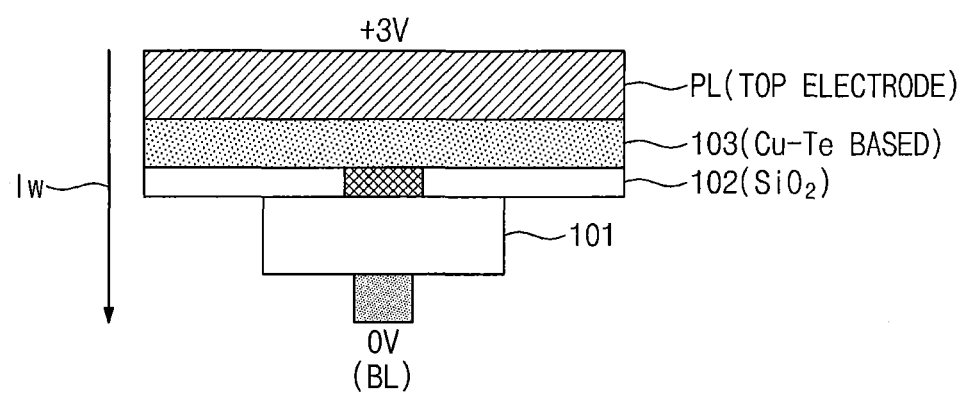
FIG. 20 is a diagram schematically illustrating a structure of a memory cell of FIG. 19 in a low-resistance state.
Figure 21:
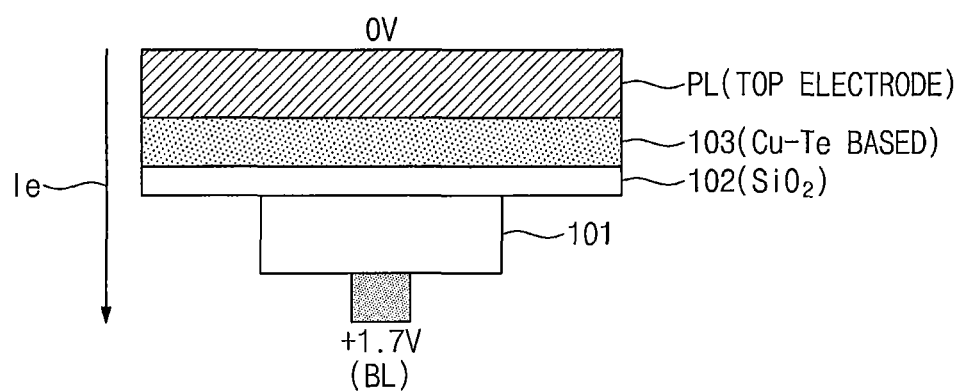
FIG. 21 is a diagram schematically illustrating a structure of a memory cell of FIG. 19 in a high-resistance state.

FIG. 20 is a diagram schematically illustrating a structure of one of the memory cells of FIG. 19 when the memory cell is in a low-resistance state. FIG. 21 is a diagram schematically illustrating a structure of one of the memory cells of FIG. 19 when the memory cell is in a high-resistance state.

Referring to FIG. 20, a memory cell contains a bottom electrode 101, a top electrode formed of a plate line PL, and a film structure (stack structure) having an insulation layer 102 and a conduction layer 103 between the bottom electrode 101 and the top electrode.

The insulation layer may include a material such as SiN, $SiO_2$, $Gd_2O_3$, etc. The conduction layer may be formed of a metal layer containing one or more of Cu, Ag, and Zr, an alloy layer (e.g., CuTe alloy layer), a metal compound layer, etc. Also, if a material of the conduction layer 103 has a characteristic prone to ionize, metallic elements other than Cu, Ag, and Zr may be used as a material of the conduction layer 103. Also, an element combined with at least one of Cu, Ag, and Zr may be at least one of S, Se, and Te. The conduction layer 103 is formed as "ion supply layer".

In FIG. 20, an embodiment of the inventive concepts is exemplified where the insulation layer 102 is formed form $SiO_2$ and the conduction layer 103 is formed from a Cu—Te based alloy compound.

A voltage in which the insulation layer 102 is set to a negative polarity and the conduction layer 103 is set to a positive polarity is applied between the bottom electrode 101 and the top electrode (plate line PL). For example, a voltage of 0 V is applied to a bit line BL, and a voltage of +3 V is applied to, for example, the plate line PL.

Cu, Ag, and Zr contained in the conduction layer 103 are ionized such that ions are drawn toward a cathode side. Conductive ions of the metallic elements are injected into the insulation film 102. In this case, an insulating nature of the insulation layer 102 is lowered, and the insulation layer 102 has a conductive nature. Accordingly, a write current Iw flows in a direction denoted in FIG. 20. This operation is referred to as a "write operation" or as a "set operation".

Referring to FIG. 21, a voltage in which the insulation layer 102 is set to a positive polarity and the conduction layer 103 is set to a negative polarity is applied between the bottom electrode 101 and the top electrode (plate line PL). For example, a voltage of +1.7 V is applied to a bit line BL, and a voltage of 0 V is applied to, for example, the plate line PL.

According to the bias condition, conductive ions in the insulation layer 102 are discharged to the conduction layer 103, so the memory cell is reset to a high-resistance state before writing. This operation is referred to as an "erase operation" or as a "reset operation". An erase current Ie flows in a direction denoted in FIG. 21 at a reset state.

Figure 22:
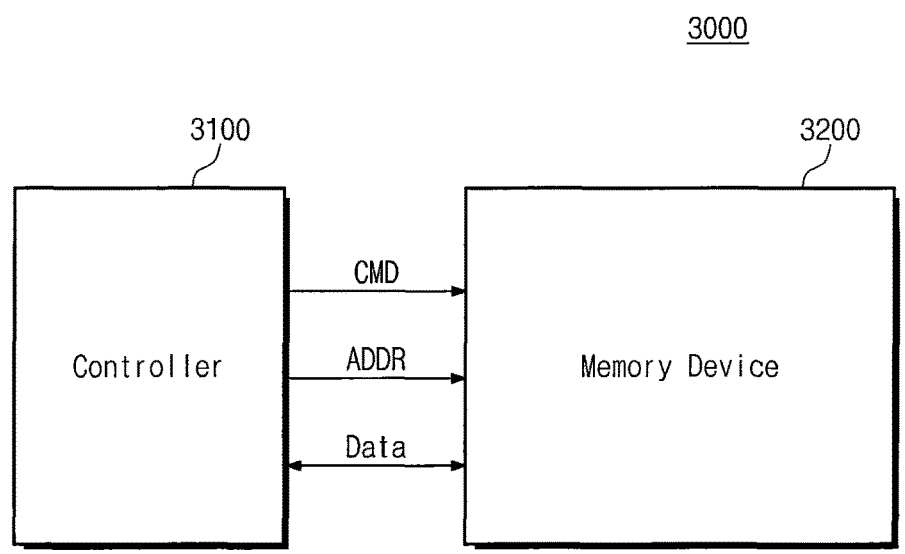
FIG. 22 is a block diagram schematically illustrating a memory system according to an exemplary embodiment of the inventive concepts.

FIG. 22 is a block diagram schematically illustrating a memory system according to an exemplary embodiment of the inventive concepts.

Referring to FIG. 22, a memory system 3000 contains a controller 3100 functioning as a memory controller and a memory device 3200 that is controlled by the controller 3100.

The memory device 3200 may be a nonvolatile memory such as a resistive memory, etc. The memory device 3200 is controlled by the controller 3100 and performs an operation (e.g., a read operation, a write operation, etc.) in response to a request of the controller 3100.

The memory device 3200 may include a sensing circuit described with reference to FIG. 2 or 3. The sensing circuit may sense data stored at a memory cell using a sensing current supplying line BL and a sensing voltage receiving line SEL that are separated from each other. Accordingly, since a sensing margin is constantly maintained regardless of whether a selected nonvolatile memory cell is in a near cell area or a far cell area, a capacity of the nonvolatile memory device may be increased, with a sensing speed considered. This may mean that a memory capacity of the memory system increases.

The controller 3100 may be connected with the host internally or externally. When receiving a request of the host, the controller 3100 provides a command CMD, an address ADDR, and data to the memory device 3200 to control read and write operations of the memory device 3200.

For example, when a write operation is performed, the controller 3100 may provide a write command and write-requested data to the memory device 3200. In this case, the controller 3100 may provide an address corresponding to the write-requested data to the memory device 3200 together with the write command and the write-requested data.

When a read operation is performed, the controller 3100 may provide a read command and an address corresponding to a read-requested area to the memory device 3200.

In exemplary embodiments, the controller 3100 may be implemented the same as or similarly to a DRAM controller and may exchange signals and data with the memory device 3200 via a DRAM interface.

Figure 23:
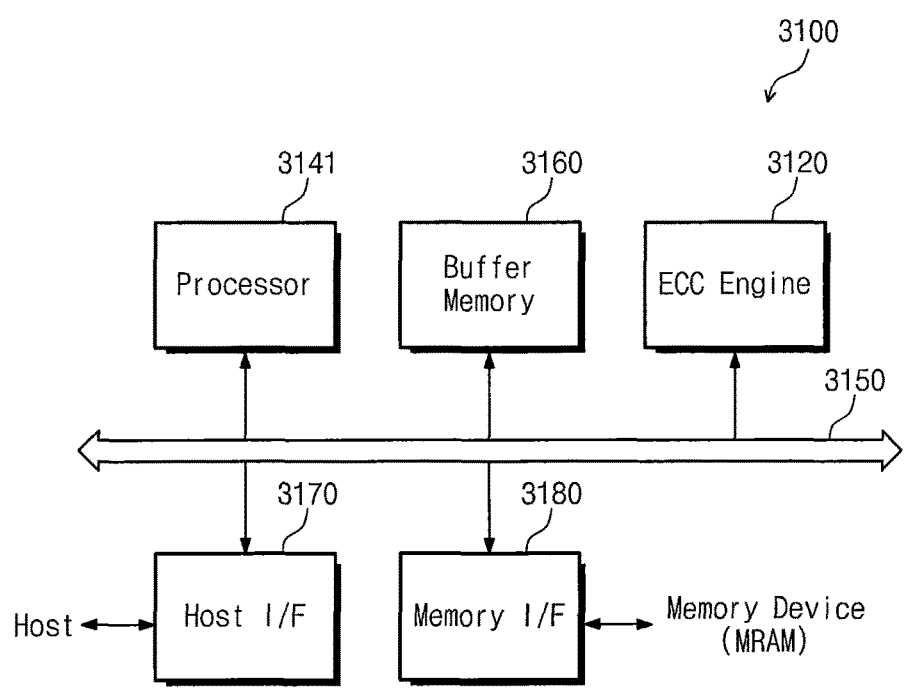
FIG. 23 is a block diagram schematically illustrating a controller of the memory system of FIG. 22.

FIG. 23 is a block diagram schematically illustrating an exemplary embodiment of the controller 3100 of FIG. 22.

Referring to FIG. 23, the controller 3100 contains a processor 3141, a buffer memory 3160, an ECC engine 3120, a system bus 3150, a host interface (I/F) 3170, and a memory interface 3180.

The processor 3141 controls overall operation of the controller 3100 and executes firmware or software.

The system bus 3150 provides a channel between the processor 3141, the buffer memory 3160, the ECC engine 3120, the host interface 3170, and the memory interface 3180.

The host interface 3170 may communicate with a host according to a specific communication protocol. For example, the host interface 3170 may communicate with the host through at least one of a variety of interface protocols, such as, but not limited to, a Universal Serial Bus (USB) protocol, a Peripheral Component Interconnection (PCI) protocol, a PCI-Express (PCI-E) protocol, an Advanced Technology Attachment (ATA) protocol, a serial-ATA protocol, a parallel-ATA protocol, a Small Computer Small Interface (SCSI) protocol, an Enhanced Small Disk Interface (ESDI) protocol, an Integrated Drive Electronics (IDE) protocol, and a Firewire protocol.

The processor 3141 receives host data and a command from the host and controls an overall operation of the controller 3100.

The buffer memory 3160 may be implemented with an SRAM, a DRAM, or a MRAM. The buffer memory 3160 may be used as at least one of a working memory, a cache memory, or a buffer memory of the controller 3100.

The ECC engine 3120 performs error correction coding on data received from the host or data received from the memory device 3200 using an error correction coding algorithm. ECC encoding and ECC decoding operations are collectively referred to as "ECC operation". The ECC engine 3120 restores a 1-bit or 2-bit error to original data using the error correction coding algorithm.

The memory interface 3180 interfaces with the memory device 3200. For example, in the event that the memory device 3200 is a resistive memory, the memory interface 3180 may include a DRAM interface or a flash memory interface, etc.

Figure 24:
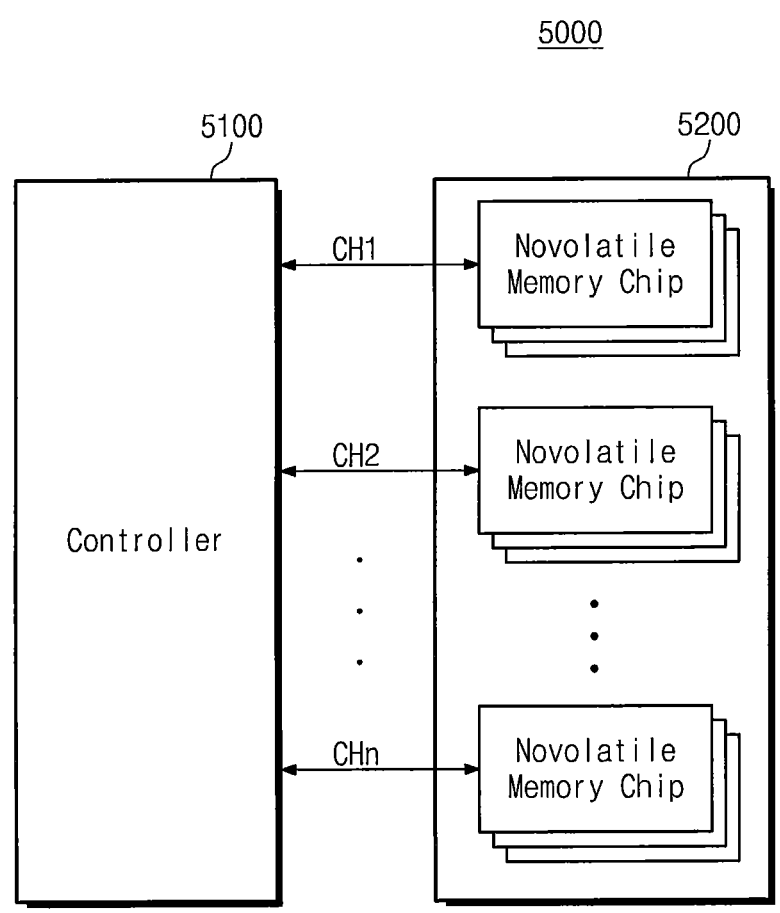
FIG. 24 is a block diagram schematically illustrating a multi-channel nonvolatile memory system according to an exemplary embodiment of the inventive concepts.

FIG. 24 is a block diagram schematically illustrating a multi-channel nonvolatile memory system that includes a plurality of nonvolatile memory chips according to an exemplary embodiment of the inventive concepts.

In FIG. 22, an embodiment of the inventive concepts is exemplified as a memory device that includes one nonvolatile memory chip. However, the scope and spirit of the inventive concepts is not limited thereto. As illustrated in FIG. 24, embodiments of the inventive concepts are applicable to memory devices that include a plurality of nonvolatile memory chips.

Referring to FIG. 24, a nonvolatile memory system 5000 contains a controller 5100 and a memory device 5200. The memory device 5200 includes a plurality of nonvolatile memory chips. The nonvolatile memory chips are divided into a plurality of groups.

Nonvolatile memory chips in each group communicate with the controller 5100 via a common channel. In FIG. 24, an embodiment of the inventive concepts is exemplified where the nonvolatile memory chips communicate with the controller 5100 via first to n-th channels CH1 to CHn. Each nonvolatile memory chip may include a sensing circuit as described with reference to FIGS. 1 to 3. The controller 5100 may be the same as or similar to the controller described with reference to FIG. 23.

Since sensing margin loss due to bit line loading between a near cell and a far cell is reduced or eliminated, a data storage capacity of the nonvolatile memory system 5000 is increased.

Figure 25:
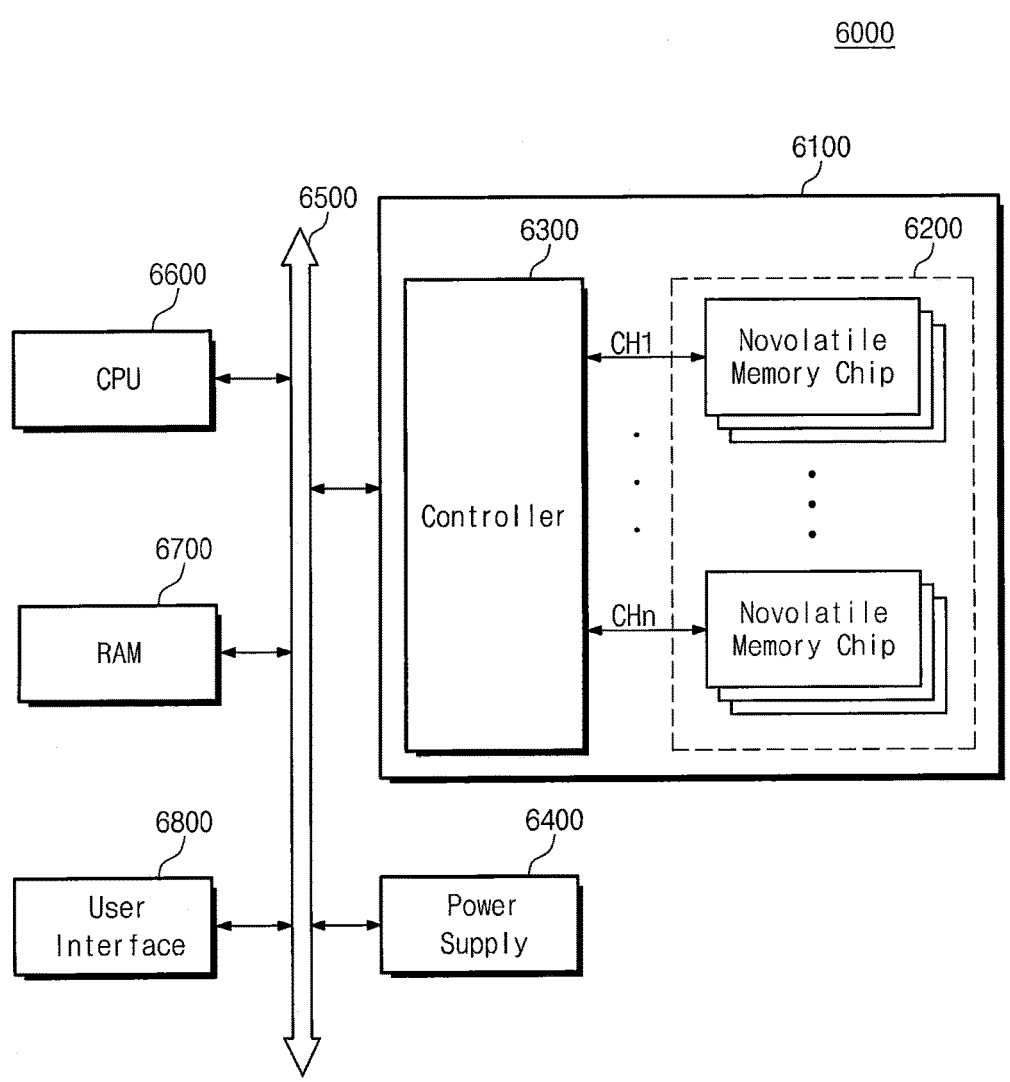
FIG. 25 is a block diagram schematically illustrating an electronic device that includes the nonvolatile memory system of FIG. 24.

FIG. 25 is a block diagram schematically illustrating an electronic device that includes the nonvolatile memory system of FIG. 24.

Referring to FIG. 25, an electronic device 6000 contains a memory system 6100, a power supply 6400, a central processing unit 6600, a RAM 6700, and a user interface 6800.

The memory system 6100 is electrically connected to the power supply 6400, the central processing unit 6600, the RAM 6700, and the user interface 6800 via a system bus 6500. Data that is provided via the user interface 6800 or is processed by the central processing unit 6600 is stored at the memory system 6100. The memory system 6100 contains a controller 6300 and a nonvolatile memory device 6200. Each chip of the nonvolatile memory device 6200 may include vertical memory cells that have a three-dimensional structure. Also, each memory cell may be one of a PRAM cell, a MRAM cell, and a ReRAM cell. Different types of memory cells may be formed in the chips. Each chip may include a sensing circuit described with reference to FIGS. 1 to 3, so the performance and storage capacity of the electronic device 6000 may be improved.

The electronic device 6000 may be provided as a computer, a Ultra-Mobile Personal Computer (UMPC), a workstation, a net-book, a Personal Digital Assistance (PDA), a Portable Computer (PC), a web tablet, a wireless phone, a mobile phone, a smart phone, a smart television, a three-dimensional television, an e-book, a Portable Multimedia Player (PMP), a portable game console, a navigation device, a black box, a digital camera, a Digital Multimedia Broadcasting (DMB) player, a digital audio recorder, a digital audio player, a digital picture recorder, a digital picture player, a digital video recorder, a digital video player, a device for transmitting and receiving information in a wireless environment, one of a variety of electronic devices constituting a home network, one of a variety of electronic devices constituting a computer network, one of a variety of electronic devices constituting a telematics network, a Radio Frequency IDentification (RFID) device, or one of various components constituting a computing system.

While the inventive concepts have been described with reference to exemplary embodiments, it will be apparent to those skilled in the art that various changes and modifications may be made without departing from the spirit and scope of the inventive concepts. Therefore, it should be understood that the above embodiments are not limiting, but illustrative.

For example, an embodiment of the inventive concepts is described mainly using a data sensing operation of a memory system including a resistive memory. In some cases, a detailed implementation may be changed by modifying, adding, or deleting a methodical configuration without departing from the spirit and scope of the inventive concepts, thereby making it possible to implement a sensing method or components of a sensing circuit differently.

What is claimed is:

1. A sensing circuit for a semiconductor memory device comprising:
    a bit line having a first end and a second end, a plurality of memory cells being connected to the bit line between the first end and the second end;
    a sensing line that is connected to the second end of the bit line;
    a current supply unit that is configured to supply a sensing current to the first end of the bit line; and
    a sense amplifier that is configured to sense data stored at a selected one of the memory cells by comparing a sensing voltage of the sensing line with a reference voltage when the sensing current flows to the selected one of the memory cells from the first end of the bit line,
    wherein, during a sensing operation of the selected one of the memory cells, the sensing current flows from the first end of the bit line to a voltage measurement node that is connected to the selected memory cell and does not flow between the voltage measurement node and the second end of the bit line.

2. The sensing circuit of claim 1, wherein the sensing line exhibits an input impedance that is sufficiently high such that substantially all of the sensing current that is injected onto the first end of the bit line flows through the selected memory cell and does not flow through the sensing line.

3. The sensing circuit of claim 1, wherein the current supply unit comprises:
    a transistor that is configured to supply and adjust the sensing current in response to a bias voltage.

4. The sensing circuit of claim 3, wherein the sense amplifier is a cross-coupled differential amplifier or a current-mirror differential amplifier voltage sense amplifier.

5. The sensing circuit of claim 1, wherein the first end of the bit line is connected to the current supply unit via a first column selection transistor during the sensing operation of the selected one of the memory cells.

6. The sensing circuit of claim 5, wherein the sensing line comprises:
    a first local input/output line that is connected to a first column selection transistor;
    a second local input/output line that is connected to a second column selection transistor and
    a jumping metal line that is connected to the second local input/output line.

7. The sensing circuit of claim 1, wherein each of the memory cells is a resistive, nonvolatile memory cell.

8. A semiconductor memory device comprising:
    a bit line having a first end and a second end, a plurality of memory cells being connected between the first end and the second end;
    a sensing line that is connected to the second end of the bit line; and
    a sensing circuit that is configured to supply a sensing current to the bit line via the first end of the bit line and to sense data stored at a selected one of the memory cells using a sensing line voltage of the sensing line during a sensing operation of the selected one of the memory cells,
    wherein each of the memory cells is an MRAM cell, a PRAM cell or a ReRAM cell.

9. The semiconductor memory device of claim 8, wherein the sensing circuit comprises:
    a first MOS transistor that is configured to generate a sensing current in response to a bias voltage;
    a second MOS transistor that is configured to adjust the sensing current in response to a clamping control voltage to clamp a voltage of a bit line node that is connected to the selected memory cell to be substantially equal to a predetermined clamping voltage;
    a comparator that is configured to compare the clamping voltage and the sensing line voltage and to generate the clamping control voltage based on a result of the comparison; and
    a sense amplifier that is configured to compare a sensing voltage of a sensing voltage node, to which the first and second MOS transistors are connected in common, with a reference voltage and output a result of the comparison as sensing data.

10. A semiconductor memory device, comprising:
    a bit line having a first end and a second end;
    a plurality of memory cells that are connected to the bit line between the first end and the second end;
    a sensing line that is connected to the second end of the bit line that exhibits an input impedance that is sufficiently high such that substantially all of a sensing current that is injected onto the first end of the bit line flows through a selected one of the memory cells without flowing over the sensing line during a sensing operation of the selected one of the memory cells.

11. The semiconductor memory device of claim 10, further comprising a sensing circuit that is configured to supply the sensing current to the bit line and to sense data stored at the selected one of the memory cells using a sensing line voltage of the sensing line.

12. The semiconductor memory device of claim 11, wherein the sensing circuit comprises:
- a current supply unit that is configured to inject the sensing current onto the first end of the bit line; and
- a sense amplifier that is configured to sense data stored at the selected one of the memory cells by comparing the sensing voltage of the sensing line with a reference voltage when the sensing current flows through the selected one of the memory cells from the first end of the bit line.

13. The semiconductor memory device of claim 11, wherein the sensing circuit comprises:
- a first MOS transistor that is configured to generate the sensing current in response to a bias voltage;
- a second MOS transistor that is configured to adjust the sensing current in response to a clamping control voltage to clamp a voltage of a bit line node that is connected to the selected memory cell to be substantially equal to a predetermined clamping voltage;
- a comparator that is configured to compare the clamping voltage and the sensing line voltage and to generate the clamping control voltage based on a result of the comparison; and
- a sense amplifier that is configured to compare a sensing voltage of a sensing voltage node, to which the first and second MOS transistors are connected in common, with a reference voltage and output a result of the comparison as sensing data.

14. The semiconductor memory device of claim 10, wherein each of the memory cells includes a respective cell transistor, the semiconductor memory device further comprising:
- a source line that has a first end and a second end, the source line connected in common to sources of the cell transistors;
- a feedback line that is connected to the second end of the source line; and
- a source line driving circuit that is configured to adjust a driving current flowing to the source line based on a difference between a feedback voltage of the feedback line and a predetermined source line reference voltage.

15. The semiconductor memory device of claim 14, wherein the source line driving circuit comprises:
- a source line current supply unit that is configured to supply the driving current to the source line via the first end of the source line in response to a driving control signal; and
- a source line driving control unit that is configured to compare the feedback voltage and the predetermined source line reference voltage to generate the driving control signal.

16. The semiconductor memory device of claim 10, wherein each of the memory cells is a nonvolatile memory cell.

* * * * *